US011276657B2

(12) United States Patent
Prevatte et al.

(10) Patent No.: US 11,276,657 B2
(45) Date of Patent: *Mar. 15, 2022

(54) CHIPLETS WITH CONNECTION POSTS

(71) Applicant: X Display Company Technology Limited, Dublin (IE)

(72) Inventors: Carl Prevatte, Raleigh, NC (US); Christopher Bower, Raleigh, NC (US); Ronald S. Cok, Rochester, NY (US); Matthew Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/543,015

(22) Filed: Aug. 16, 2019

(65) Prior Publication Data
US 2019/0371753 A1    Dec. 5, 2019

Related U.S. Application Data

(62) Division of application No. 14/822,864, filed on Aug. 10, 2015, now Pat. No. 10,468,363.

(51) Int. Cl.
*H01L 23/00* (2006.01)
*H05K 3/34* (2006.01)
(Continued)

(52) U.S. Cl.
CPC .............. *H01L 24/11* (2013.01); *H01L 24/08* (2013.01); *H01L 24/13* (2013.01); *H01L 24/14* (2013.01);
(Continued)

(58) Field of Classification Search
CPC ......... H01L 24/04; H01L 24/08; H01L 24/13; H01L 2224/1144
See application file for complete search history.

(56) References Cited

U.S. PATENT DOCUMENTS 3,379,937 A    4/1968  Shepherd
4,617,730 A   10/1986  Geldermans et al.
(Continued)

FOREIGN PATENT DOCUMENTS

EP    0281100 B1    6/1992
JP    H11-142878 A    5/1999
(Continued)

OTHER PUBLICATIONS

Bower, C. A. et al., Micro-Transfer-Printing: Heterogeneous Integration of Microscale Semiconductor Devises using Elastomer Stamps, IEEE Conference, (2014).
(Continued)

*Primary Examiner* — David A Zarneke
(74) *Attorney, Agent, or Firm* — Choate, Hall & Stewart LLP; Michael D. Schmitt

(57) ABSTRACT

A component includes a plurality of electrical connections on a process side opposed to a back side of the component. Each electrical connection includes an electrically conductive multi-layer connection post protruding from the process side. A printed structure includes a destination substrate and one or more components. The destination substrate has two or more electrical contacts and each connection post is in contact with, extends into, or extends through an electrical contact of the destination substrate to electrically connect the electrical contacts to the connection posts. The connection posts or electrical contacts are deformed. Two or more connection posts can be electrically connected to a common electrical contact.

15 Claims, 19 Drawing Sheets

(51) Int. Cl.
*H05K 1/11* (2006.01)
*H05K 3/30* (2006.01)

(52) U.S. Cl.
CPC .............. *H01L 24/17* (2013.01); *H05K 1/112* (2013.01); *H05K 3/3436* (2013.01); *H01L 2224/1144* (2013.01); *H01L 2224/11466* (2013.01); *H01L 2224/13017* (2013.01); *H01L 2224/13023* (2013.01); *H01L 2224/1357* (2013.01); *H01L 2224/1403* (2013.01); *H01L 2224/1412* (2013.01); *H01L 2224/1418* (2013.01); *H01L 2224/1624* (2013.01); *H01L 2224/16227* (2013.01); *H01L 2224/17107* (2013.01); *H01L 2924/12041* (2013.01); *H01L 2924/12043* (2013.01); *H01L 2924/12044* (2013.01); *H01L 2924/1304* (2013.01); *H05K 3/305* (2013.01); *H05K 2201/0979* (2013.01); *H05K 2201/09409* (2013.01); *H05K 2201/09472* (2013.01); *H05K 2201/10143* (2013.01)

(56) References Cited

U.S. PATENT DOCUMENTS

| | | | |
|---|---|---|---|
| 4,934,267 A | 6/1990 | Hashimoto et al. | |
| 4,940,181 A | 7/1990 | Juskey, Jr. et al. | |
| 5,172,303 A | 12/1992 | Bernardoni et al. | |
| 5,196,726 A | 3/1993 | Nishiguchi et al. | |
| 5,214,308 A | 5/1993 | Nishiguchi et al. | |
| 5,326,412 A | 7/1994 | Schreiber et al. | |
| 5,329,423 A | 7/1994 | Scholz | |
| 5,342,207 A | 8/1994 | Sobhani | |
| 5,354,205 A | 10/1994 | Feigenbaum et al. | |
| 5,376,825 A | 12/1994 | Tukamoto et al. | |
| 5,388,577 A | 2/1995 | Hubbard | |
| 5,459,158 A | 10/1995 | Moore et al. | |
| 5,525,065 A | 6/1996 | Sobhani | |
| 5,550,066 A | 8/1996 | Tang et al. | |
| 5,556,808 A | 9/1996 | Williams et al. | |
| 5,557,149 A | 9/1996 | Richards et al. | |
| 5,621,555 A | 4/1997 | Park | |
| 5,666,272 A | 9/1997 | Moore et al. | |
| 5,815,303 A | 9/1998 | Berlin | |
| 5,831,832 A * | 11/1998 | Gillette | H01L 24/16 361/760 |
| 5,929,521 A | 7/1999 | Wark et al. | |
| 5,938,455 A | 8/1999 | Glovatsky et al. | |
| 6,025,730 A | 2/2000 | Akram et al. | |
| 6,042,391 A | 3/2000 | Bodo et al. | |
| 6,051,489 A | 4/2000 | Young et al. | |
| 6,114,221 A | 9/2000 | Tonti et al. | |
| 6,172,423 B1 | 1/2001 | Lee | |
| 6,180,239 B1 | 1/2001 | Whitesides et al. | |
| 6,245,594 B1 | 6/2001 | Wu et al. | |
| 6,277,669 B1 | 8/2001 | Kung et al. | |
| 6,278,242 B1 | 8/2001 | Cok et al. | |
| 6,400,021 B1 | 6/2002 | Cho | |
| 6,448,108 B1 * | 9/2002 | Lin | H01L 21/2885 257/E21.175 |
| 6,544,813 B1 * | 4/2003 | Lin | H01L 21/2885 257/E21.175 |
| 6,555,408 B1 | 4/2003 | Jacobsen et al. | |
| 6,577,367 B2 | 6/2003 | Kim | |
| 6,643,434 B2 | 11/2003 | Cayrefourcq et al. | |
| 6,717,263 B2 | 4/2004 | Sawai et al. | |
| 6,717,560 B2 | 4/2004 | Cok et al. | |
| 6,756,576 B1 | 6/2004 | McElroy et al. | |
| 6,768,195 B2 | 7/2004 | Drost | |
| 6,781,224 B2 * | 8/2004 | Yoneda | H01L 21/4846 257/686 |
| 6,841,853 B2 | 1/2005 | Yamada | |
| 6,900,076 B2 | 5/2005 | Komiyama et al. | |
| 6,933,532 B2 | 8/2005 | Arnold et al. | |
| 6,964,881 B2 | 11/2005 | Chua et al. | |
| 6,969,624 B2 * | 11/2005 | Iwafuchi | H01L 33/0093 438/22 |
| 6,974,711 B2 | 12/2005 | Yanagisawa et al. | |
| 6,998,644 B1 | 2/2006 | Boling et al. | |
| 7,102,241 B2 * | 9/2006 | Tao | H01L 23/3107 257/779 |
| 7,109,063 B2 | 9/2006 | Jiang | |
| 7,115,495 B2 | 10/2006 | Wark et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,202,677 B2 | 4/2007 | Pedersen et al. | |
| 7,259,391 B2 | 8/2007 | Liu et al. | |
| 7,288,753 B2 | 10/2007 | Cok | |
| 7,354,801 B2 | 4/2008 | Sugiyama et al. | |
| 7,380,007 B1 | 5/2008 | Bu et al. | |
| 7,427,557 B2 | 9/2008 | Rinne et al. | |
| 7,453,157 B2 | 11/2008 | Haba et al. | |
| 7,473,586 B1 * | 1/2009 | Lo | H01L 21/4846 257/E21.499 |
| 7,521,292 B2 | 4/2009 | Rogers et al. | |
| 7,534,652 B2 * | 5/2009 | Haba | H01L 24/13 438/108 |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,622,367 B1 | 11/2009 | Nuzzo et al. | |
| 7,635,611 B2 | 12/2009 | Jiang | |
| 7,662,545 B2 | 2/2010 | Nuzzo et al. | |
| 7,667,335 B2 | 2/2010 | Lin et al. | |
| 7,691,656 B2 | 4/2010 | Bader et al. | |
| 7,704,684 B2 | 4/2010 | Rogers et al. | |
| 7,749,887 B2 | 7/2010 | Lee | |
| 7,799,699 B2 | 9/2010 | Nuzzo et al. | |
| 7,816,856 B2 | 10/2010 | Cok et al. | |
| 7,893,533 B2 | 2/2011 | Saito | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,977,789 B2 | 7/2011 | Park | |
| 7,982,296 B2 | 7/2011 | Nuzzo et al. | |
| 7,999,454 B2 | 8/2011 | Winters et al. | |
| 8,008,182 B2 | 8/2011 | Asakawa | |
| 8,021,907 B2 | 9/2011 | Pagaila et al. | |
| 8,029,139 B2 | 10/2011 | Ellinger et al. | |
| 8,035,226 B1 | 10/2011 | Wilcoxen et al. | |
| 8,039,847 B2 | 10/2011 | Nuzzo et al. | |
| 8,110,425 B2 | 2/2012 | Yun | |
| 8,124,459 B2 * | 2/2012 | Yoon | H01L 21/568 438/123 |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,344,495 B2 * | 1/2013 | Camacho | H01L 21/568 257/690 |
| 8,394,706 B2 | 3/2013 | Nuzzo et al. | |
| 8,440,546 B2 | 5/2013 | Nuzzo et al. | |
| 8,449,285 B2 | 5/2013 | McGeehan | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,530,351 B2 * | 9/2013 | Nakamura | H05K 3/4007 438/667 |
| 8,558,243 B2 | 10/2013 | Bibl et al. | |
| 8,664,699 B2 | 3/2014 | Nuzzo et al. | |
| 8,669,173 B2 | 3/2014 | Lee | |
| 8,685,764 B2 | 4/2014 | Chu et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,809,672 B2 | 8/2014 | Chuang et al. | |

(56) References Cited

U.S. PATENT DOCUMENTS

| | | | |
|---|---|---|---|
| 8,817,369 | B2 | 8/2014 | Daiku |
| 8,835,940 | B2 | 9/2014 | Hu et al. |
| 8,854,294 | B2 | 10/2014 | Sakariya |
| 8,865,489 | B2 | 10/2014 | Rogers et al. |
| 8,871,547 | B2 | 10/2014 | Chu et al. |
| 8,877,648 | B2 | 11/2014 | Bower et al. |
| 8,889,485 | B2 | 11/2014 | Bower |
| 8,890,315 | B2 | 11/2014 | Choi et al. |
| 8,895,406 | B2 | 11/2014 | Rogers et al. |
| 8,934,259 | B2 | 1/2015 | Bower et al. |
| 8,941,194 | B1* | 1/2015 | Lo ............... H01L 23/3128 257/415 |
| 8,941,215 | B2 | 1/2015 | Hu et al. |
| 8,963,326 | B2 | 2/2015 | Bao et al. |
| 8,987,765 | B2 | 3/2015 | Bibl et al. |
| 9,006,031 | B2* | 4/2015 | Camacho ............ H01L 24/19 438/109 |
| 9,082,910 | B2 | 7/2015 | Lee et al. |
| 9,105,714 | B2 | 8/2015 | Hu et al. |
| 9,111,464 | B2 | 8/2015 | Bibl et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,166,114 | B2 | 10/2015 | Hu et al. |
| 9,178,123 | B2 | 11/2015 | Sakariya et al. |
| 9,209,112 | B2 | 12/2015 | Imai |
| 9,214,410 | B2* | 12/2015 | Kim ............... H01L 24/81 |
| 9,217,541 | B2 | 12/2015 | Bathurst et al. |
| 9,219,016 | B2 | 12/2015 | Lin et al. |
| 9,224,680 | B2 | 12/2015 | Chen et al. |
| 9,238,309 | B2 | 1/2016 | King et al. |
| 9,240,397 | B2 | 1/2016 | Bibl et al. |
| 9,252,094 | B2 | 2/2016 | Choi et al. |
| 9,252,375 | B2 | 2/2016 | Bibl et al. |
| 9,307,652 | B2 | 4/2016 | Bower |
| 9,358,775 | B2 | 6/2016 | Bower et al. |
| 9,367,094 | B2 | 6/2016 | Bibl et al. |
| 9,368,683 | B1 | 6/2016 | Meitl et al. |
| 9,391,040 | B2 | 7/2016 | Dang et al. |
| 9,401,344 | B2 | 7/2016 | Bower et al. |
| 9,412,727 | B2 | 8/2016 | Menard et al. |
| 9,478,583 | B2 | 10/2016 | Hu et al. |
| 9,484,504 | B2 | 11/2016 | Bibl et al. |
| 9,508,666 | B2 | 11/2016 | Yu et al. |
| 9,520,537 | B2 | 12/2016 | Bower et al. |
| 9,550,353 | B2 | 1/2017 | Bower et al. |
| 9,555,644 | B2 | 1/2017 | Rogers et al. |
| 9,583,533 | B2 | 2/2017 | Hu et al. |
| 9,601,356 | B2 | 3/2017 | Bower et al. |
| 9,607,958 | B2* | 3/2017 | Lin ............... H01L 24/05 |
| 9,640,715 | B2 | 5/2017 | Bower et al. |
| 9,704,821 | B2 | 7/2017 | Meitl et al. |
| 9,716,082 | B2 | 7/2017 | Bower et al. |
| 9,761,754 | B2 | 9/2017 | Bower et al. |
| 9,865,832 | B2 | 1/2018 | Bibl et al. |
| 10,103,069 | B2 | 10/2018 | Bower et al. |
| 10,468,391 | B2 | 11/2019 | Cok |
| 10,750,614 | B2 | 8/2020 | Haba et al. |
| 10,777,521 | B2 | 9/2020 | Meitl et al. |
| 10,796,971 | B2* | 10/2020 | Cok ............... H01L 33/387 |
| 11,064,609 | B2 | 7/2021 | Cok |
| 2001/0003296 | A1 | 6/2001 | Morimoto et al. |
| 2002/0050220 | A1 | 5/2002 | Schueller et al. |
| 2003/0017712 | A1 | 1/2003 | Brendel |
| 2003/0027083 | A1 | 2/2003 | Fuller et al. |
| 2003/0183947 | A1 | 10/2003 | Ohuchi |
| 2003/0222353 | A1 | 12/2003 | Yamada |
| 2004/0043533 | A1 | 3/2004 | Chua et al. |
| 2004/0192041 | A1 | 9/2004 | Jeong et al. |
| 2004/0259290 | A1 | 12/2004 | Brintzinger et al. |
| 2005/0181655 | A1 | 8/2005 | Haba et al. |
| 2005/0202595 | A1 | 9/2005 | Yonehara et al. |
| 2005/0285246 | A1 | 12/2005 | Haba et al. |
| 2006/0051900 | A1 | 3/2006 | Shizuno |
| 2006/0063309 | A1 | 3/2006 | Sugiyama et al. |
| 2007/0018321 | A1 | 1/2007 | Hiatt et al. |
| 2007/0075423 | A1 | 4/2007 | Ke et al. |
| 2007/0080464 | A1 | 4/2007 | Goebel et al. |
| 2007/0085102 | A1 | 4/2007 | Orita |
| 2007/0088906 | A1 | 4/2007 | Mizushima et al. |
| 2007/0120268 | A1 | 5/2007 | Irsigler et al. |
| 2007/0145550 | A1 | 6/2007 | Haba et al. |
| 2008/0067663 | A1 | 3/2008 | Kang et al. |
| 2008/0108171 | A1 | 5/2008 | Rogers et al. |
| 2008/0111146 | A1 | 5/2008 | Nakamura et al. |
| 2008/0131822 | A1 | 6/2008 | Liao et al. |
| 2008/0150121 | A1 | 6/2008 | Oganesian et al. |
| 2008/0164575 | A1 | 7/2008 | Ikeda et al. |
| 2008/0185705 | A1 | 8/2008 | Osborn et al. |
| 2008/0202365 | A1 | 8/2008 | Schneider et al. |
| 2009/0014205 | A1 | 1/2009 | Kobayashi et al. |
| 2009/0020870 | A1 | 1/2009 | Watanabe et al. |
| 2009/0065773 | A1 | 3/2009 | Ishikawa et al. |
| 2009/0133914 | A1 | 5/2009 | Dellmann et al. |
| 2009/0146303 | A1 | 6/2009 | Kwon |
| 2009/0199960 | A1 | 8/2009 | Nuzzo et al. |
| 2009/0229861 | A1 | 9/2009 | Hando et al. |
| 2009/0283903 | A1 | 11/2009 | Park |
| 2009/0301771 | A1 | 12/2009 | Ochi et al. |
| 2010/0006876 | A1 | 1/2010 | Moteki et al. |
| 2010/0062098 | A1 | 3/2010 | Ando et al. |
| 2010/0096175 | A1 | 4/2010 | Ishimatsu et al. |
| 2010/0123134 | A1 | 5/2010 | Nagata |
| 2010/0123268 | A1 | 5/2010 | Menard |
| 2010/0147567 | A1 | 6/2010 | Hino et al. |
| 2010/0155989 | A1 | 6/2010 | Ishii et al. |
| 2010/0190293 | A1 | 7/2010 | Maeda et al. |
| 2010/0248484 | A1 | 9/2010 | Bower et al. |
| 2010/0265440 | A1 | 10/2010 | French et al. |
| 2010/0289115 | A1 | 11/2010 | Akiyama et al. |
| 2010/0308008 | A1 | 12/2010 | Zhu et al. |
| 2010/0313241 | A1* | 12/2010 | Lee ............... H04W 12/06 726/3 |
| 2011/0140271 | A1 | 6/2011 | Daubenspeck et al. |
| 2011/0182805 | A1 | 7/2011 | DeSimone et al. |
| 2011/0219973 | A1 | 9/2011 | Gullentops et al. |
| 2011/0266670 | A1 | 11/2011 | England et al. |
| 2012/0000379 | A1 | 1/2012 | Greener et al. |
| 2012/0043130 | A1 | 2/2012 | Rathburn |
| 2012/0074532 | A1 | 3/2012 | Shih et al. |
| 2012/0104624 | A1 | 5/2012 | Choi et al. |
| 2012/0118939 | A1 | 5/2012 | Kusanagi et al. |
| 2012/0126229 | A1 | 5/2012 | Bower |
| 2012/0168776 | A1 | 7/2012 | Nakamura et al. |
| 2012/0206421 | A1 | 8/2012 | Cok et al. |
| 2012/0228669 | A1 | 9/2012 | Bower et al. |
| 2012/0256346 | A1 | 10/2012 | Ogino et al. |
| 2012/0281379 | A1 | 11/2012 | Shimada |
| 2012/0306073 | A1 | 12/2012 | Yu et al. |
| 2012/0313241 | A1 | 12/2012 | Bower |
| 2012/0314388 | A1 | 12/2012 | Bower et al. |
| 2012/0321738 | A1 | 12/2012 | Ishii et al. |
| 2012/0328728 | A1 | 12/2012 | Nakatsuka et al. |
| 2013/0068720 | A1 | 3/2013 | Taniguchi |
| 2013/0069275 | A1 | 3/2013 | Menard et al. |
| 2013/0077272 | A1 | 3/2013 | Lin et al. |
| 2013/0078576 | A1 | 3/2013 | Wu et al. |
| 2013/0088416 | A1 | 4/2013 | Smith et al. |
| 2013/0119536 | A1 | 5/2013 | Hada et al. |
| 2013/0196474 | A1 | 8/2013 | Meitl et al. |
| 2013/0207964 | A1 | 8/2013 | Fleck et al. |
| 2013/0221355 | A1 | 8/2013 | Bower et al. |
| 2013/0228897 | A1 | 9/2013 | Chen et al. |
| 2013/0273695 | A1 | 10/2013 | Menard et al. |
| 2013/0309792 | A1 | 11/2013 | Tischler et al. |
| 2013/0333094 | A1 | 12/2013 | Rogers et al. |
| 2013/0337608 | A1 | 12/2013 | Kotani et al. |
| 2014/0015124 | A1 | 1/2014 | Fay et al. |
| 2014/0084450 | A1 | 3/2014 | Nielson et al. |
| 2014/0084482 | A1 | 3/2014 | Hu et al. |
| 2014/0094878 | A1 | 4/2014 | Gossler et al. |
| 2014/0104243 | A1 | 4/2014 | Sakariya et al. |
| 2014/0159064 | A1 | 6/2014 | Sakariya et al. |
| 2014/0159065 | A1 | 6/2014 | Hu et al. |

(56) References Cited

U.S. PATENT DOCUMENTS

| | | |
|---|---|---|
| 2014/0159066 A1 | 6/2014 | Hu et al. |
| 2014/0182912 A1 | 7/2014 | Lin et al. |
| 2014/0252604 A1 | 9/2014 | Motoyoshi |
| 2014/0264763 A1 | 9/2014 | Meitl et al. |
| 2014/0267683 A1 | 9/2014 | Bibl et al. |
| 2014/0327132 A1 | 11/2014 | Zhang et al. |
| 2014/0340900 A1 | 11/2014 | Bathurst et al. |
| 2014/0367633 A1 | 12/2014 | Bibl et al. |
| 2015/0028473 A1 | 1/2015 | Kim et al. |
| 2015/0102807 A1 | 4/2015 | Eckinger et al. |
| 2015/0135525 A1 | 5/2015 | Bower |
| 2015/0137153 A1 | 5/2015 | Bibl et al. |
| 2015/0163906 A1 | 6/2015 | Bower et al. |
| 2015/0318328 A1 | 11/2015 | Bibl et al. |
| 2015/0348926 A1 | 12/2015 | Bower |
| 2015/0371874 A1 | 12/2015 | Bower et al. |
| 2016/0016399 A1 | 1/2016 | Bower et al. |
| 2016/0018094 A1 | 1/2016 | Bower et al. |
| 2016/0020120 A1 | 1/2016 | Bower et al. |
| 2016/0020127 A1 | 1/2016 | Bower et al. |
| 2016/0020130 A1 | 1/2016 | Bower et al. |
| 2016/0020131 A1 | 1/2016 | Bower et al. |
| 2016/0020187 A1 | 1/2016 | Okada et al. |
| 2016/0056223 A1 | 2/2016 | Bower et al. |
| 2016/0093600 A1 | 3/2016 | Bower et al. |
| 2016/0111387 A1 | 4/2016 | Dang et al. |
| 2016/0262268 A1 | 9/2016 | Co et al. |
| 2017/0047303 A1 | 2/2017 | Meitl et al. |
| 2017/0047306 A1 | 2/2017 | Meitl et al. |
| 2017/0154819 A1 | 6/2017 | Bower et al. |
| 2017/0213803 A1 | 7/2017 | Bower |
| 2017/0287789 A1 | 10/2017 | Bower et al. |
| 2017/0338374 A1 | 11/2017 | Zou et al. |
| 2020/0105697 A1 | 4/2020 | Prevatte et al. |
| 2020/0243467 A1 | 7/2020 | Prevatte et al. |

FOREIGN PATENT DOCUMENTS

| | | |
|---|---|---|
| JP | 2005 099410 A | 4/2005 |
| WO | WO-2008/103931 A2 | 8/2008 |
| WO | WO-2016/012409 A2 | 1/2016 |
| WO | WO-2017/167954 A2 | 10/2017 |

OTHER PUBLICATIONS

Bower, C. A. et al., Transfer Printing: An Approach for Massively Parallel Assembly of Microscale Devices, IEEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer, J. W. et al., 63.2: AMOLED Displays Using Transfer-Printed Integrated Circuits, SID 09 DIGEST, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Roscher, H., VCSEL Arrays with Redundant Pixel Designs for 10Gbits/s 2-D Space-Parallel MMF Transmission, Annual Report, optoelectronics Department, (2005).

Trindade, A.J. et al., Precision transfer printing of ultra-thin AlInGaN micron-size light-emitting diodes, Crown, pp. 217-218, (2012).

Yaniv et al., A 640 x 480 Pixel Computer Display Using Pin Diodes with Device Redundancy, 1988 International Display Research Conference, IEEE, CH-2678-1/88:152-154 (1988).

\* cited by examiner

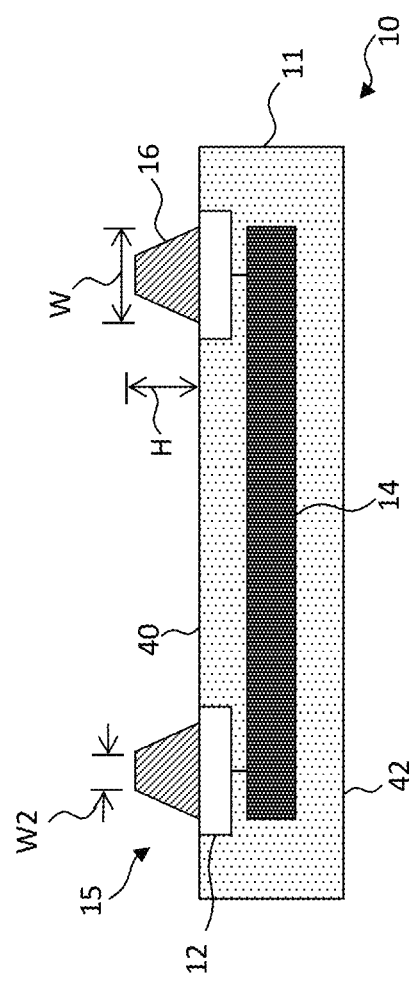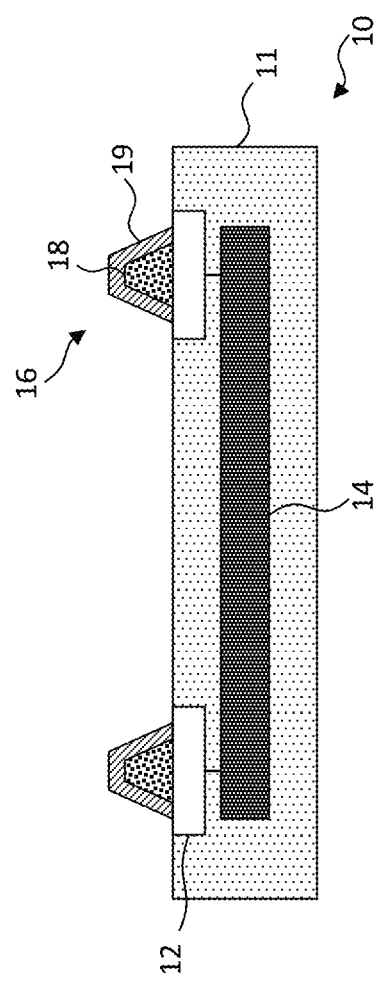

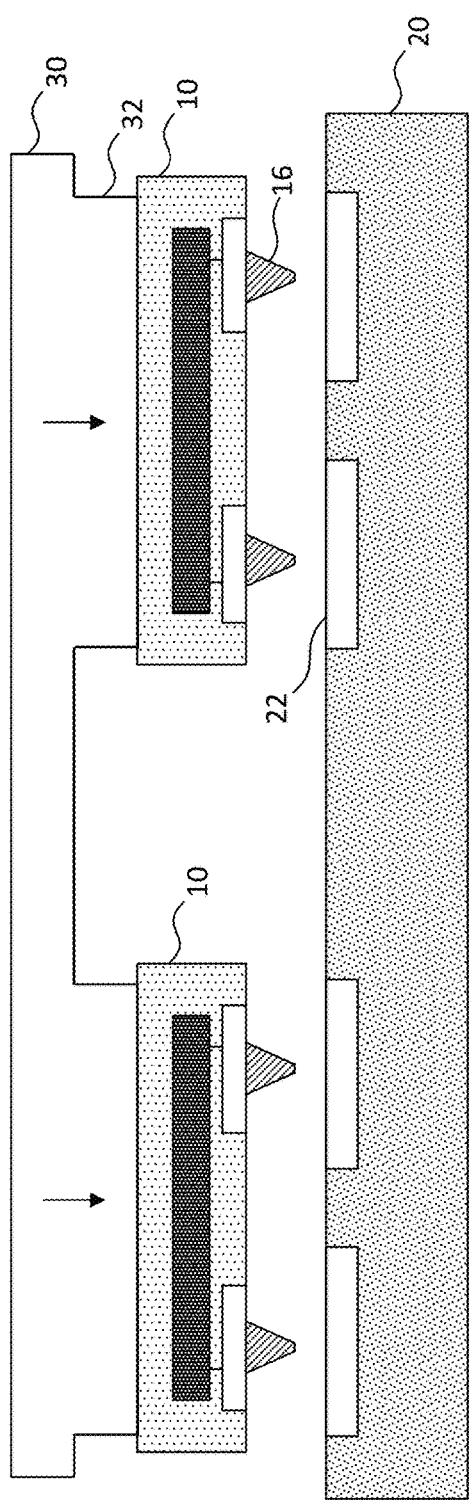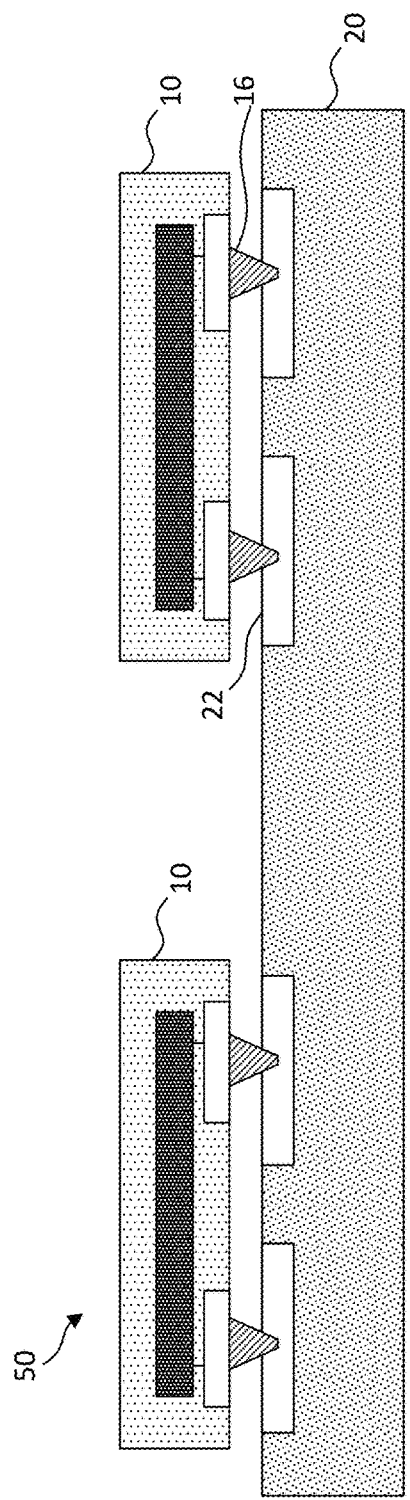

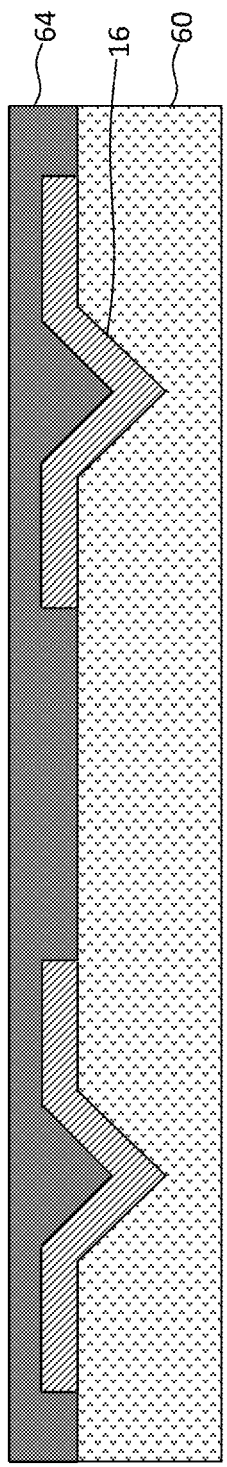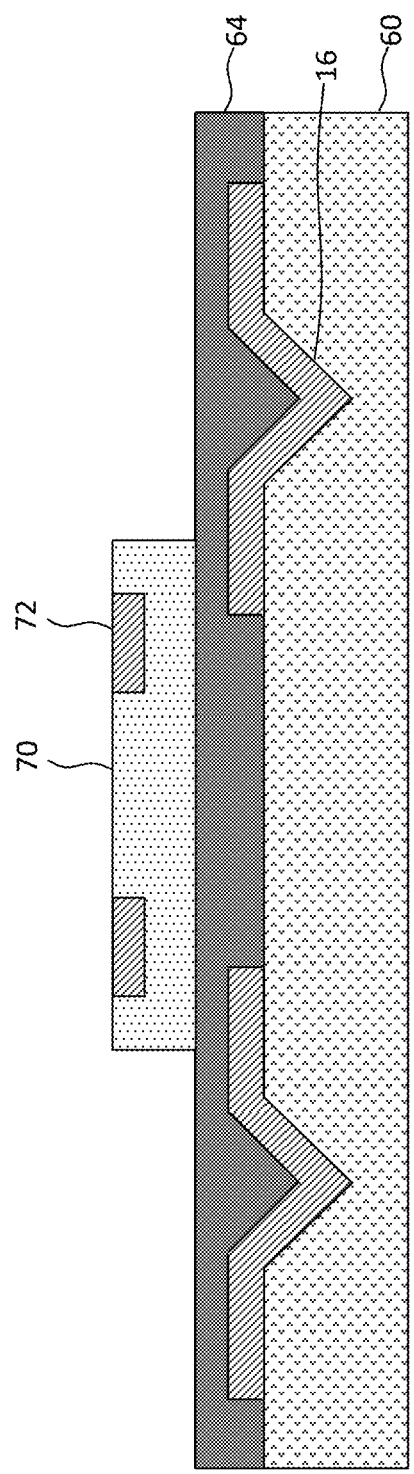

CHIPLETS WITH CONNECTION POSTS

PRIORITY APPLICATION

This application is a division of U.S. patent application Ser. No. 14/822,864, filed on Aug. 10, 2015, entitled Chiplets with Connection Posts, the disclosure of which is hereby incorporated by reference in its entirety.

FIELD OF THE INVENTION

The present invention relates to structures and methods for electrically interconnecting chiplets to backplane contact pads using micro transfer printing.

BACKGROUND OF THE INVENTION

Substrates with electronically active components distributed over the extent of the substrate may be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application 2010/0289115 and U.S. Patent Application 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled Formation of Display Transistor Array Panel describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example it can be difficult to form a continuous conductor from the destination substrate to the small integrated circuit because of the differences in height over the surface between the small integrated circuits and the destination substrate.

There is a need, therefore, for structures and methods that enable the electrical interconnection of small integrated circuits, such as micro transfer printed chiplets, to destination substrates.

SUMMARY OF THE INVENTION

In accordance with embodiments of the present invention, components such as chiplets incorporating active elements such as transistors and passive elements such as resistors, capacitors, and conductors are micro transfer printed from a native source wafer to a non-native destination substrate or backplane. The components include an electrically conducting connection post that protrudes from a component surface and is brought into contact with a backplane contact pad to form an electrical connection between the component and the destination substrate. The components can be at least partially adhered to the destination substrate by forcefully driving the connection posts into the backplane contact pads when micro transfer printing, for example by exerting mechanical pressure on the transfer stamp. The connection posts, the backplane contact pads, or both the connection posts and backplane contact pads can be deformed or crumpled and the connection post can be driven into or through the backplane contact pad, thereby wedging the connection post in the backplane contact pad to adhere the connection post to the backplane contact pad and form an electrical contact between them. As a consequence, the connection post can be welded to the backplane contact pad. An additional heat treatment can be provided to facilitate the welding. Alternatively or additionally, a layer of metal, for example a solder can be provided on either the surface of the connection post or the backplane contact pad, or both, that can be heated, causing the solder to reflow and thereby both adhere and electrically connect the connection post to the backplane contact pad. In a further embodiment of the present invention, a defective chiplet is removed from the backplane contact pad, extracting the connection post from the backplane contact pad. The defective chiplet can be replaced, for example by micro transfer printing a different chiplet to the backplane contact pads in the former location of the defective chiplet.

In another embodiment of the present invention, two or more connection posts are provided to contact a common backplane contact pad. By providing two or more connection posts in contact with a common backplane contact pad, faults in electrical connections between the component and the backplane contact pad are reduced by providing a redundant electrical connection from the component to the backplane contact pad.

Because the components can be made using integrated circuit photolithographic techniques having a relatively high resolution and cost and the destination substrate, for example a printed circuit board, can be made using printed circuit board techniques having a relatively low resolution and cost, the backplane contact pads on the destination substrate can be much larger than the connection posts or electrical contacts on the component, facilitating the use of multiple connection posts with a common backplane contact pads, reducing electrical faults, and reducing manufacturing costs.

In one aspect, the disclosed technology includes a printable component, including: a chiplet having a semiconductor substrate; and a plurality of electrical connections, wherein each electrical connection comprises an electrically conductive connection post protruding from the semiconductor substrate, wherein the connection post is a multilayer connection post.

In certain embodiments, the connection post comprises a bulk material coated with a conductive material different from the bulk material.

In certain embodiments, the bulk material is electrically conductive.

In certain embodiments, the conductive material has a melting point less than the melting point of the bulk material.

In certain embodiments, the bulk material is an electrical insulator.

In certain embodiments, the bulk material is a resin, a polymer, or a cured resin.

In certain embodiments, the bulk material is softer than the conductive material.

In certain embodiments, the conductive material is softer than the bulk material.

In certain embodiments, the printable component is an active component having an active element, a passive component having a passive element, or a compound structure having a plurality of active elements, passive elements, or a combination of active and passive elements.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In another aspect, the disclosed technology includes a printable component, including: a chiplet having a semiconductor substrate; and a plurality of electrical connections protruding from the semiconductor substrate, wherein each electrical connection comprises an electrically conductive connection post protruding from the process side, wherein two or more adjacent connection posts are directly electrically connected to each other.

In certain embodiments, the two or more adjacent connection posts comprise a first and a second connection post of different heights.

In certain embodiments, the connection posts are disposed in groups and a spacing between adjacent connection posts within a given group is less than a spacing between adjacent groups.

In certain embodiments, the connection posts within a group are electrically shorted together.

In certain embodiments, the printable component is an active printable component having an active element, a passive printable component having a passive element, or a compound printable component having a plurality of active elements, passive elements, or a combination of active and passive elements.

In certain embodiments, each of the two or more connection posts is multi-layer connection post.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In another aspect, the disclosed technology includes a printed structure comprising a destination substrate and one or more printable components, wherein the destination substrate has two or more electrical contacts and each connection post is in contact with, extends into, or extends through an electrical contact of the destination substrate to electrically connect the electrical contacts to the connection posts.

In certain embodiments, the electrical contact comprises a material that is the same material as a material included in the connection post.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a printed structure comprising a destination substrate and one or more printable components, each of the printable components including: a chiplet having a semiconductor substrate; a plurality of electrical connections, wherein each electrical connection comprises an electrically conductive connection post protruding from the semiconductor substrate or a layer in contact with the semiconductor substrate, wherein the destination substrate comprises two or more backplane contact pads, wherein each connection post is in contact with, extends into, or extends through a backplane contact pad of the destination substrate to electrically connect the backplane contact pads to the connection posts, and wherein one or more of the backplane contact pads, one or more of the connection posts, or both one or more of the backplane contact pads and one or more of the connection posts is deformed or crumpled, or has a non-planar surface.

In certain embodiments, the two or more backplane contact pads comprise a material that is softer than that of the connection post.

In certain embodiments, the connection posts comprise a material that is softer than that of the two or more backplane contact pads.

In certain embodiments, a conductive material other than a material of the backplane contact pad or the connection post adheres or electrically connects (e.g., or both) the backplane contact pad to the conductive post.

In certain embodiments, the backplane contact pad has a first conductive layer and a second conductive layer over the first conductive layer, and the second conductive layer has a lower melting temperature than the first conductive layer, wherein the backplane contact pad is coated with a non-conductive layer, or wherein the backplane contact pad is formed on a compliant non-conductive layer.

In certain embodiments, the second conductive layer is a solder.

In certain embodiments, the electrical contact is welded to the connection post.

In certain embodiments, the backplane contact pads are non-planar and the connection posts are inserted into the backplane contact pads.

In certain embodiments, the printable component has at least one of a width, length, and height from 2 to 5 µm, 5 to 10 µm, 10 to 20 µm, or 20 to 50 µm.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each of the one or more printable components is a light-emitting diode, photo-diode, or transistor.

In another aspect, the disclosed technology includes a printed structure comprising a destination substrate and one or more printable components, the printable components including: a chiplet having a semiconductor substrate and a plurality of electrical connections, wherein: each electrical connection comprises an electrically conductive connection post protruding from the semiconductor substrate, the destination substrate has two or more backplane contact pads, each connection post is in contact with, extends into, or extends through a backplane contact pad of the destination substrate to electrically connect the backplane contact pads to the connection posts, and two or more connection posts are electrically connected to one backplane contact pad.

In certain embodiments, the distance between two or more connection posts is less than a width or length of the electrical contact in a direction parallel to the destination substrate.

In certain embodiments, the connection posts are disposed in groups, the connection posts within a group are electrically connected to a common backplane contact pad and the connection posts in different groups are electrically connected to different backplane contact pads.

In certain embodiments, the printable component has at least one of a width, length, and height from 2 to 5 µm, 5 to 10 µm, 10 to 20 µm, or 20 to 50 µm.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a method of making a printable component, including: providing a forming substrate having two or more forms in a surface of the substrate; disposing a patterned layer of conductive material at least in the forms to make connection posts; disposing a first dielectric layer over the patterned layer of conductive material and the forming substrate; disposing a chiplet having chiplet contact pads on the first dielectric layer; forming conductors electrically connecting the connection posts to the chiplet contact pads; and defining the printable component to form a release layer and anchors in the forming substrate connected by tethers to the printable component.

In certain embodiments, the method includes providing a destination substrate having two or more backplane contact pads; and micro transfer printing the printable component to the destination substrate so that each connection post is in contact with, extends into, or extends through a backplane contact pad of the destination substrate to electrically connect the backplane contact pads to the connection posts and the chiplet contact pads.

In certain embodiments, the method includes disposing a patterned second dielectric layer over the first dielectric layer, the conductors, and the chiplet.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In another aspect, the disclosed technology includes a printable component, including: a first dielectric layer having connection posts protruding from the dielectric layer; a chiplet having a semiconductor substrate and chiplet contact pads, the chiplet disposed on the first dielectric layer; and conductors electrically connecting the connection posts to the chiplet contact pads.

In certain embodiments, the chiplet contact pads are located on a same side of the chiplet adjacent to the connection posts.

In certain embodiments, the printable component includes a patterned electrical connection layer between the connection posts and the chiplet contact pads.

In certain embodiments, the chiplet contact pads are located on a side of the chiplet opposite the connection posts.

In certain embodiments, the printable component includes a second dielectric layer disposed at least partly over the first dielectric layer.

In certain embodiments, the second dielectric layer is transparent, and the component is a light-emitting component that emits light through the second dielectric layer.

In certain embodiments, the connection post is a multi-layer connection post.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In another aspect, the disclosed technology includes a destination substrate for receiving transfer-printed printable components, including: a substrate having a surface; and a plurality of non-planar backplane contact pads formed on or in the substrate, wherein the non-planar backplane contact pads have a perimeter portion surrounding a central portion, and wherein the perimeter portion is closer to the surface than the central portion (e.g., the central portion is recessed).

In certain embodiments, at least one of (i), (ii), and (iii) is true: (i) the backplane contact pad has a first conductive layer and a second conductive layer over the first conductive layer and the second conductive layer has a lower melting temperature than the first conductive layer, (ii) wherein the backplane contact pad is coated with a non-conductive layer, and (iii) wherein the backplane contact pad is formed on a compliant non-conductive layer.

In certain embodiments, the second conductive layer is a solder.

In certain embodiments, the non-conductive layer is a polymer or an adhesive or the compliant non-conductive layer is a polymer.

In certain embodiments, the compliant non-conductive layer is a polymer.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the printable component has at least one of a width, length, and height from 2 to 5 µm, 5 to 10 µm, 10 to 20 µm, or 20 to 50 µm.

In certain embodiments, the printable components are light-emitting diodes, photo-diodes, or transistors.

In another aspect, the disclosed technology includes a printed structure comprising a destination substrate and one or more printable components, the printable components comprising a chiplet having a semiconductor substrate and a plurality of electrical connections, wherein: each electrical connection comprises an electrically conductive connection post protruding from the semiconductor substrate, the destination substrate has two or more backplane contact pads on a backplane surface and each connection post is in contact with, extends into, or extends through a backplane contact pad of the destination substrate to electrically connect the backplane contact pads to the connection posts, the backplane contact pads are non-planar, have a perimeter portion surrounding a central portion, and wherein the perimeter portion is closer to the backplane surface than the central portion, and the connection posts are inserted into the backplane contact pads.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In another aspect, the disclosed technology includes a printed structure including: a destination substrate; one or more printable components, the printable components comprising a chiplet having a semiconductor substrate and a plurality of electrical connections, wherein: each electrical connection comprises an electrically conductive connection post protruding from the semiconductor substrate, and the destination substrate having two or more backplane contact pads and each connection post is in contact with, extends into, or extends through a backplane contact pad of the destination substrate to electrically connect the backplane contact pads to the connection posts; and an adhesive material located within a volume between the connection posts of a printable component.

In certain embodiments, the adhesive material underfills the volume and applies compression between the printable component and the destination substrate.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In certain embodiments, a layer in contact with the semiconductor substrate is between the connection post and the semiconductor substrate.

In certain embodiments, the connection post has a height that is greater than its base width.

In certain embodiments, the connection post has a base width that is greater than its peak width.

In certain embodiments, the connection post has a base area that is greater than its peak area.

In certain embodiments, a layer in contact with the semiconductor substrate is between the connection post and the semiconductor substrate.

In certain embodiments, a layer in contact with the semiconductor substrate is between the connection post and the semiconductor substrate.

In certain embodiments, a layer in contact with the semiconductor substrate is between the connection post and the semiconductor substrate.

In certain embodiments, a layer in contact with the semiconductor substrate is between the connection post and the semiconductor substrate.

The present invention provides structures and methods that enable the construction of electrical interconnections between small integrated circuits that are transfer printed on a destination substrate. The electrical interconnection process is simple and inexpensive requiring fewer process steps than known alternative methods.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 is a cross section of an embodiment of the present invention;

FIG. 2 is a cross section of another embodiment of the present invention having multi-layer connection posts;

FIG. 5 is a cross section illustrating micro-transfer printing a component onto a destination substrate according to a method of the present invention;

FIGS. 6-9 are printed structures according to various embodiment of the present invention having different connection posts.

FIGS. 13-20 are cross sections illustrating steps of making a printable component in a method of the present invention;

Figure 3:
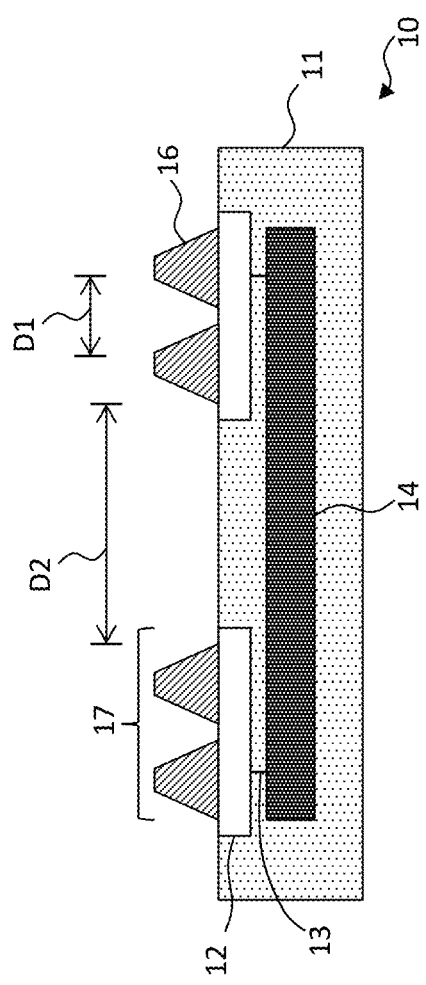
FIG. 3 is a cross section of an alternative embodiment of the present invention having electrically shorted redundant connection posts.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides a structure and method for electrically connecting relatively small electrical components such as integrated circuit chiplets to a relatively large destination substrate in an efficient and cost-effective way. Referring to the cross section of FIG. 1, in an embodiment of the present invention, a component 10 includes a plurality of electrical connections 15 on a process side 40 opposed to a back side 42 of the component 10. Each electrical connection 15 includes an electrically conductive connection post 16 protruding from the process side 40. The electrical connection 15 can also include a component contact pad 12 on which the connection post 16 is disposed and to which the connection post 16 is electrically connected.

The component 10 can be an active component, for example including one or more active elements such as electronic transistors or diodes or light-emitting diodes and photodiodes that produce an electrical current in response to ambient light. Alternatively, the component 10 can be a passive component, for example including one or more passive elements such as resistors, capacitors, or conductors. In another embodiment, the component 10 is a compound component 10 that includes both active and passive elements. The component 10 can be a semiconductor device having one or more semiconductor layers 11, such as an integrated circuit. The component 10 can be an unpackaged die. In yet another embodiment, the component 10 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro transfer printed itself after the elements have been arranged thereon. The components 10 can be electronic processors, controllers, drivers, light-emitting diodes, photodiodes, light-control devices, or light-management devices.

The components 10 made by methods of the present invention can include or be a variety of chiplets having semiconductor structures, including a diode, a light-emitting diode (LED), a transistor, or a laser. Chiplets are small integrated circuits and can be unpackaged dies released from a source wafer and can be micro transfer printed. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm. The chiplet or components 10 can be micro-light-emitting diodes with a length greater than width, for example having an aspect ratio greater than or equal to 2, 4, 8, 10, 20, or 50 and component contact pads 12 that are adjacent to the ends of the printable semiconductor components 10 along the length of the printable semiconductor components 10. This structure enables low-precision manufacturing processes to electrically connect wires to the f component contact pads 12 without creating registration problems and possible unwanted electrical shorts or opens.

The components 10 can include active elements such as electronic circuits 14 formed using lithographic processes and can include passive elements such as electrical connections, e.g., wires, to the component contact pads 12 and connection posts 16. In certain embodiments, the component contact pads 12 are planar electrical connections formed on the process side 40 of the component 10 and source wafer. Such component contact pads 12 are typically formed from metals such as aluminum or polysilicon using masking and deposition processes used in the art. In certain embodiments, the component contact pads 12 are electrically connected to the circuit 14 with wires 13. In another embodiment the component contact pads 12 are directly electrically connected to the circuit 14 without intervening wires. In some embodiments, component contact pads 12 and the circuit 14, together with other functional structures formed in the active layer on the source wafer make up the component 10, or chiplet.

In some embodiments, the contact pads 12 are omitted and the connection posts are electrically connected to the circuit 14 with the wires 13. In other embodiments, each contact pad 12 and its respective connection post 16 are a single component (e.g., formed together as contact terminal).

In some embodiments of the present invention, the components 10 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet components 10 can be made in a source semiconductor wafer (e.g., a silicon or GaN wafer) having a process side 40 and a back side 42 used to handle and transport the wafer. Components 10 are formed using lithographic processes in an active layer on or in the process side 40 of the source wafer. An empty release layer space is formed beneath the components 10 with tethers connecting the components 10 to the source wafer in such a way that pressure applied against the components 10 breaks the tethers to release the components 10 from the source wafer. Methods of forming such structures are described, for example, in the paper AMOLED Displays using Transfer-Printed Integrated Circuits and U.S. Pat. No. 8,889,485 referenced above. Lithographic processes for forming components 10 in a source wafer, for example transistors, wires, and capacitors, can be used in the integrated circuit art.

According to various embodiments of the present invention, the native source wafer can be provided with the components 10, release layer, tethers, and connection posts 16 already formed, or they can be constructed as part of the process of the present invention.

Figure 30:
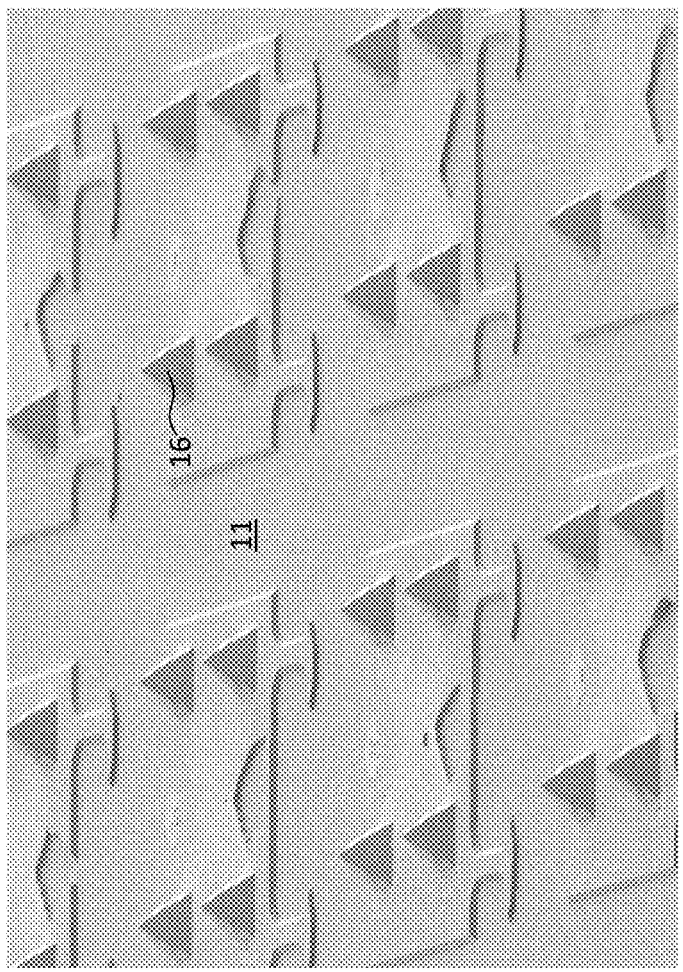
FIG. 30 is a micrograph of connection posts formed on a substrate according to an embodiment of the present invention.

Connection posts 16 are electrical connections formed on the process side 40 of the component 10 that extend generally perpendicular to the surface of the process side 40. Such connection posts 16 can be formed from metals such as aluminum, titanium, tungsten, copper, silver, gold, or other conductive metals. The connection posts 16 can be formed by repeated masking and deposition processes that build up three-dimensional structures. In some embodiments, the connection posts 16 are made of one or more high elastic modulus metals, such as tungsten. As used herein, a high elastic modulus is an elastic modulus sufficient to maintain the function and structure of the connection post 16 when pressed into a backplane contact pads 22, as described further below with respect to FIGS. 5-9. FIG. 30 is a micrograph of connection posts 16 made on a semiconductor substrate.

In certain embodiments, the electrical connections 15 include patterned metal layers forming component contact pads 12. The contact pads 12 can be made using integrated circuit photolithographic methods. Likewise, the connection posts 16 can be made by etching one or more layers of metal evaporated or sputtered on the process side 40 of the component 10. Such structures can also be made by forming a layer above the component 10 surface, etching a well into the surface, filling it with a conductive material such as metal, and then removing the layer. In some embodiments, the connection posts 16 are electrically connected to the circuit 14 and the connection posts 16 and the circuit 14, together with other functional active or passive structures formed in the active layer on the source wafer, make up the component 10.

The connection posts 16 can have a variety of aspect ratios and typically have a peak area smaller than a base area. The connection posts 16 can have a sharp point for embedding in or piercing backplane contact pads 22 (described further below). Components 10 with protruding connection posts 16 generally are discussed in U.S. Pat. No. 8,889,485 whose contents are incorporated by reference herein in their entirety.

As shown in the Figures, the connection posts 16 can have a base width W representing a planar dimension of the connection post 16 on the process side 40 and a height H representing the extent of the connection post 16 from the process side 40 to the peak of the connection post 16. The peak of the connection post 16 can have a width W2 less than W that, in an embodiment, approaches zero so the connection post 16 has a sharp point. The base of the connection post 16 can have a base area in contact with the process side 40 and a peak area smaller than the base area. The connection post 16 can also have a height H greater than a base dimension.

Referring to FIG. 2, in an embodiment the connection posts 16 include a post material 18 coated with an electrically conductive material 19 different from the post material 18. The post material 18 can be an electrically conductive metal or a doped or undoped semiconductor or an electrically insulating polymer, for example a resin, cured, resin, or epoxy and can have any of a variety of hardness or elastic modulus values. In an embodiment, the post material 18 is softer than the conductive material 19 so that the conductive material 19 can crumple when the connection post is under mechanical pressure. Alternatively, the conductive material 19 is softer than the post material 18 so that it deforms before the post material 18 when under mechanical pressure. By deform is meant that the connection posts 16 or the backplane contact pads 22 or conductive material 19 change shape as a consequence of the transfer printing.

The multi-layer connection post 16 can be made using photolithographic methods, for example coating and then pattern-wise curing materials such as resins or metals that can be etched. The connection post 16 or post material 18 can be a semiconductor materiel, such as silicon or GaN, formed by etching material from around the connection post 16. Coatings, such as the conductive material 19 can be evaporated or sputtered over the post material 18 structure and then pattern-wise etched to form the multi-layer connection post 16 of FIG. 2. The conductive material 19 can be a solder or other metal or metal alloy that flows under a relatively low temperature, for example less than 120 degrees C. In particular, the conductive material 19 can have a melting point less than the melting point of the post material 18.

Referring next to FIG. 3, in an embodiment of the present invention, two or more connection posts 16 are directly electrically connected. As shown in FIG. 3, two or more connection posts 16 together form groups 17 of connection posts 16. The connection posts 16 in a common group 17 are electrically connected or shorted, for example by a component contact pad 12. In a useful arrangement, the connection posts 16 in a common group 17 are separated by a distance D1 that is less than the distance D2 between connection posts 16 in different groups 17 so that the connection posts 16 within a group 17 are located closer together than connection posts 16 in different groups 17. In yet another embodiment, referring to FIG. 4, a short connection post 16A has a different height H than another connection post 16, for example another connection post 16 within a common group 17 with the short connection post 16A. Multiple connection posts 16 and connection posts 16 having different heights that are electrically connected provide a redundant means for connection to a common electrical connection. As those skilled in the art will understand, it is important that electrical connections between the components 10 and an external electrical structure such as a backplane are reliable and effective. By providing multiple connection posts 16 and connection posts 16 with different structures, such as heights, that are electrically connected in the component 10, the likelihood of an electrical connection failure between the component 10 and an external device are reduced.

Referring next to FIGS. 5 and 6, in an embodiment of the present invention, a printed structure 50 includes a destination substrate 20 that is a different substrate than the substrates of the components 10 and is not native to the components 10. The destination substrate 20 can be a backplane and has one or more components 10 and two or more backplane contact pads 22. Each connection post 16 is in contact with, extends into, or extends through a backplane contact pad 22 of the destination substrate 20 to electrically connect the backplane contact pads 22 to the connection posts 16. The backplane contact pads 22 can be electrically conductive and connected through wires or conductive traces to other components or structures on the destination substrate 20.

The backplane contact pads 22 can be made of a relatively soft metal, such as tin, solder, or tin-based solder, to assist in forming good electrical contact with the connection posts 16 and adhesion with the components 10. As used herein, a soft metal may refer to a metal into which a connection post 16 can be pressed to form an electrical connection between the connection post 16 and the backplane contact pad 22. In this arrangement, the backplane contact pad 22 can plastically deform and flow under mechanical pressure to provide a good electrical connection between the connection post 16 and the backplane contact pad 22.

In another embodiment of the present invention, the connection posts 16 can include a soft metal and the backplane contact pads 22 include a high elastic modulus metal. In this arrangement, the connection posts 16 can plastically deform and flow under mechanical pressure to provide a good electrical connection between the connection post 16 and the backplane contact pads 22.

If an optional adhesive layer is formed on the destination substrate 20, the connection posts 16 can be driven through the adhesive layer to form an electrical connection with the backplane contact pads 22 beneath the adhesive layer. The adhesive layer can be cured to more firmly adhere the components 10 to the destination substrate 20 and maintain a robust electrical connection between the connection posts 16 and backplane contact pads 22 in the presence of mechanical stress. The adhesive layer can undergo some shrinkage during the curing process that can further strengthen the electrical connectivity and adhesion between the connection post 16 and the backplane contact pads 22.

As shown in FIG. 5, a transfer stamp 30 has a plurality of pillars 32 formed thereon and spatially aligned to the components 10. The transfer stamp 30 can be made of an elastomeric material, such as PDMS. The pillars 32 protrude from and are spatially arranged on the process side 40 of the transfer stamp 30 so that each pillar 32 can be aligned with a component 10. The pillars 32 are in contact with the components 10 and are moved in alignment with and towards the destination substrate 20 so that the connection posts 16 of the components 10 come in contact with the backplane contact pads 22 of the destination substrate 20 (FIG. 6).

Figure 7B:
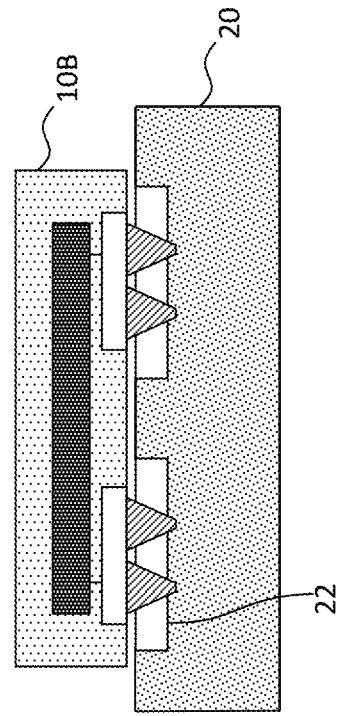
Figure 8B:
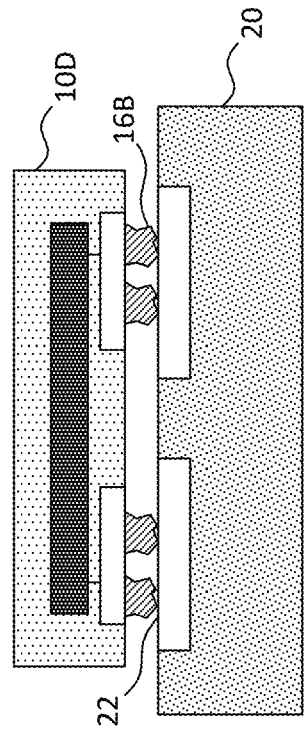
Figure 7A:
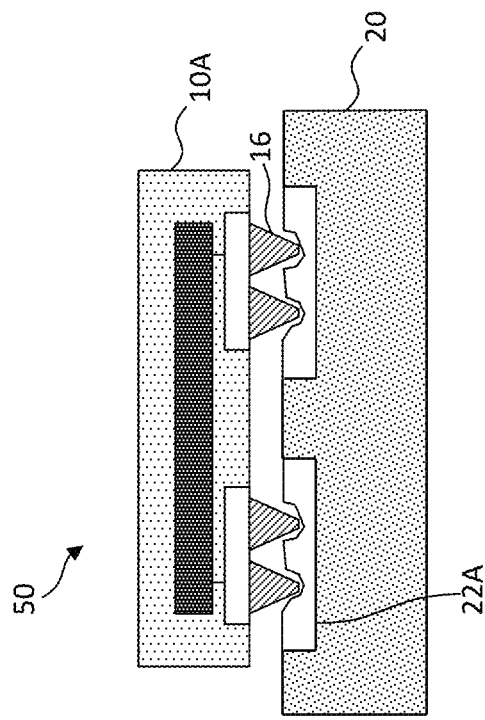
Figure 8A:
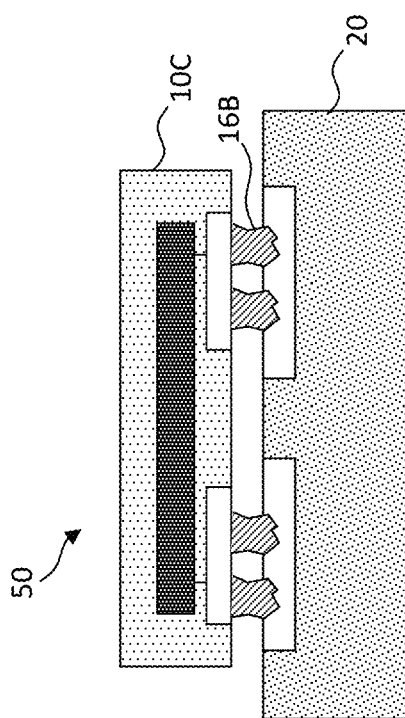

In alternative embodiments of the present invention, the connection posts 16 of the components 10 are in contact with, are embedded in, or pierce the backplane contact pads 22 of the destination substrate 20. FIG. 6 shows a connection post 16 embedded in a backplane contact pad 22; in other, or additional embodiments, either or both one or more of the connection posts 16 and the backplane contact pads 22 are deformed or crumpled into a non-planar shape or are deformed so that the surfaces of the connection posts 16 and the backplane contact pads 22 change shape on contact with each other. FIG. 7A illustrates a deformed or crumpled backplane contact pad 22A (connected to component 10A). FIG. 7B illustrates a connection post 16 piercing a backplane contact pad 22 (connected to component 10B). FIG. 8A illustrates deformed or crumpled connection posts 16B embedded in a backplane contact pad 22 (connected to component 10C). FIG. 8B illustrates a deformed or crumpled connection post 16B in contact with a backplane contact pad 22 (connected to component 10D). The deformation or crumpling can improve the electrical connection between the connection posts 16 and the backplane contact pads 22 by increasing the surface area that is in contact between the connection posts 16 and the backplane contact pads 22. To facilitate deformation, in an embodiment the two or more connection posts 16 have a composition softer than that of the backplane contact pads 22 or the backplane contact pads 22 have a composition softer the two or more connection posts 16.

As noted above with reference to FIG. 2, a multi-layer connection post can include a conductive material 19 coated over a post material 18. The conductive material 19 can be a solder that is melted to promote the electrical connection between the connection posts 16 and the backplane contact pad 22. In an alternative embodiment illustrated in FIG. 9, the backplane contact pads 22 include or are coated with a conductive material or solder 24. The connection posts 16 can contact, be embedded in, or pierce the conductive material 24. In some embodiments, the backplane contact pad 22 has a first conductive layer and a second conductive layer over the first conductive layer, and the second conductive layer has a lower melting temperature than the first conductive layer. With a subsequent heat treatment, the solder can reflow and promote the electrical connection between the connection posts 16 and the backplane contact pads 22. In yet another embodiment, both the connection posts 16 and the backplane contact pads 22 include a layer of conductive material such as solder or have a layer of conductive material other than the material making up the connection posts 16 or backplane contact pads 22 that electrically connects the backplane contact pad 22 to the connection post 16. As noted above, a heat treatment can also serve to weld the backplane contact pad 22 to the connection post 16. Welding can be facilitated by providing a common material on the surfaces of the connection posts 16 and the backplane contact pads 22.

Figure 22:
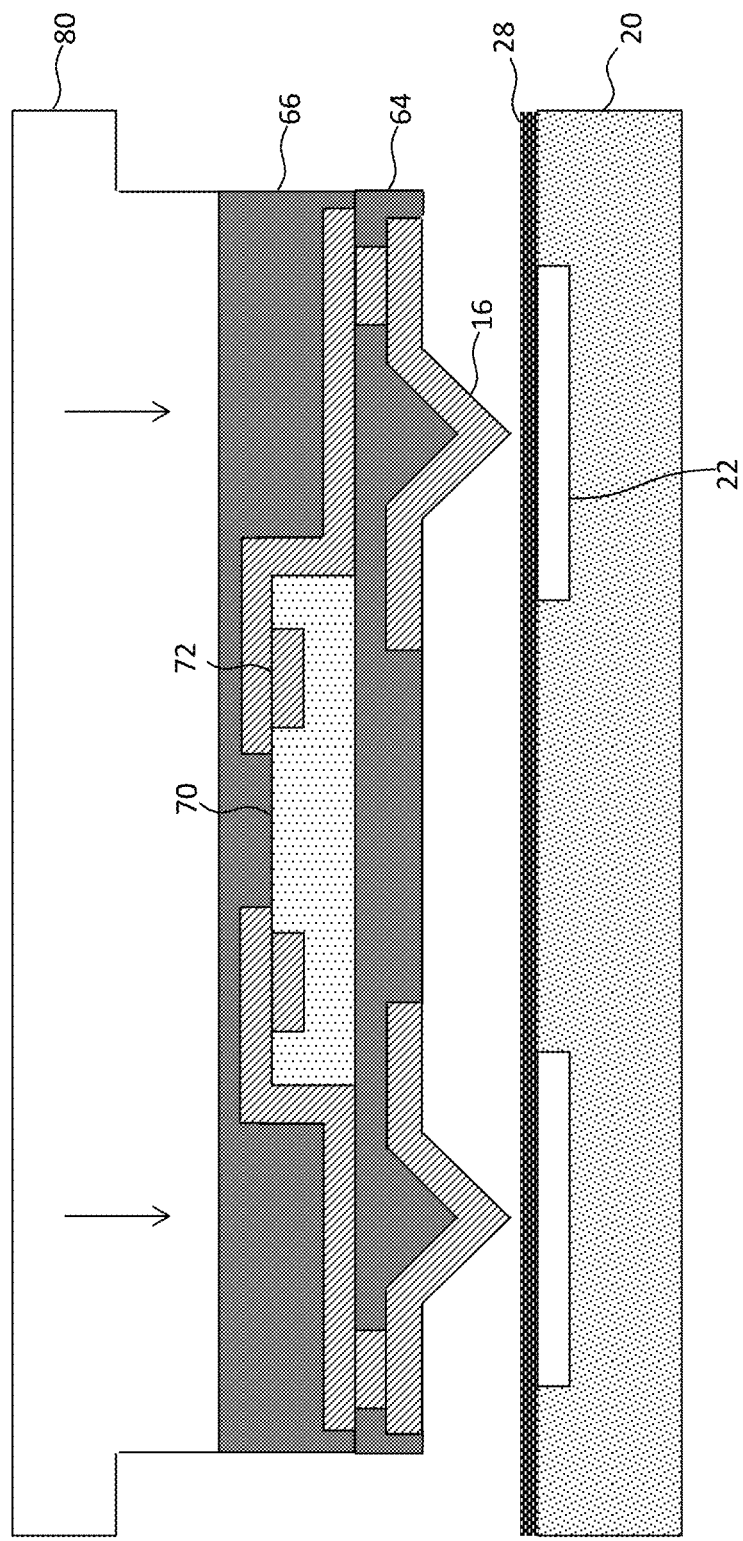

In another embodiment, the backplane contact pads are coated with an optional polymer layer that can extend over the destination substrate (for example as shown in FIG. 22 described further below). The connection posts 16 of the printable components are driven through the polymer layer to make electrical contact with the backplane contact pads 22. The polymer layer can protect the backplane contact pads 22 and serve to embed the connection posts 16 in the backplane contact pads 22 by adhering to the connection posts 16. Alternatively, a compliant polymer layer is formed beneath the backplane contact pads 22 to facilitate the mechanical contact made when the connection posts 16 are embedded in the backplane connection pads 22. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 16 to the backplane contact pads 22.

Figure 4:
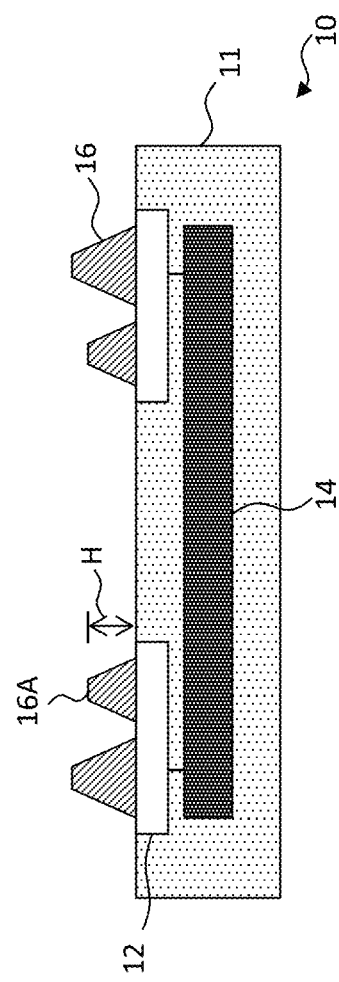
FIG. 4 is a cross section of an embodiment of the present invention having electrically shorted redundant connection posts with different heights.
Figure 9:
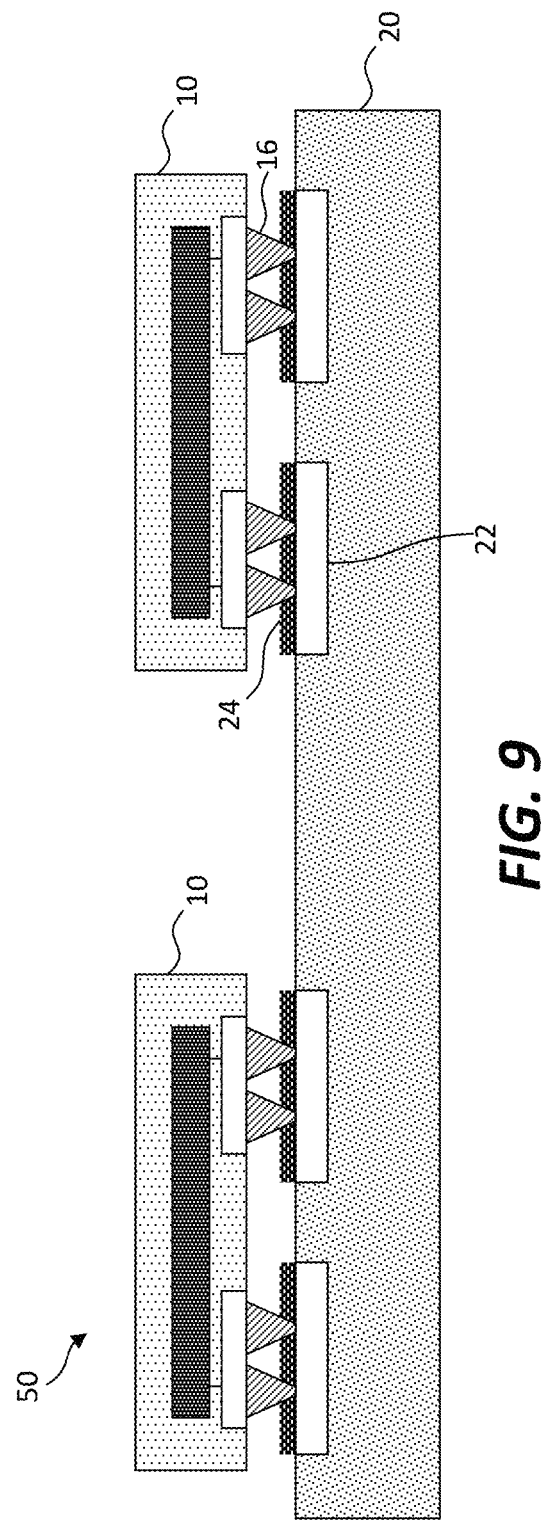

As shown in FIGS. 3 and 4, in an embodiment two or more connection posts 16 are electrically shorted in a component 10. When electrically connected to a backplane contact pad 22, the two or more connection posts 16 are electrically connected to one backplane contact pad 22 as shown in FIGS. 7-9. Such redundant electrical connections reduce contact failures between the connection posts 16 and the backplane contact pads 22. To facilitate such electrical connections and to prevent shorting between adjacent backplane contact pads 22, as shown and described with respect to FIG. 3, the connection posts 16 in a common group 17 are separated by a distance D1 that is less than the distance D2 between connection posts 16 in different groups 17 so that the connection posts 16 within a group 17 are located closer together than connection posts 16 in different groups 17. Furthermore, as shown in FIGS. 7-9, in an embodiment, the distance between two or more connection posts 16 (e.g., D1, FIG. 3) is less than a width or length of the electrical contact in a direction parallel to the destination substrate 20. Thus, in an embodiment the connection posts 16 are disposed in groups 17, the connection posts 16 within a group 17 are electrically connected to a common backplane contact pad 22 and the connection posts 16 in different groups 17 are electrically connected to different backplane contact pads 22.

Figure 10:
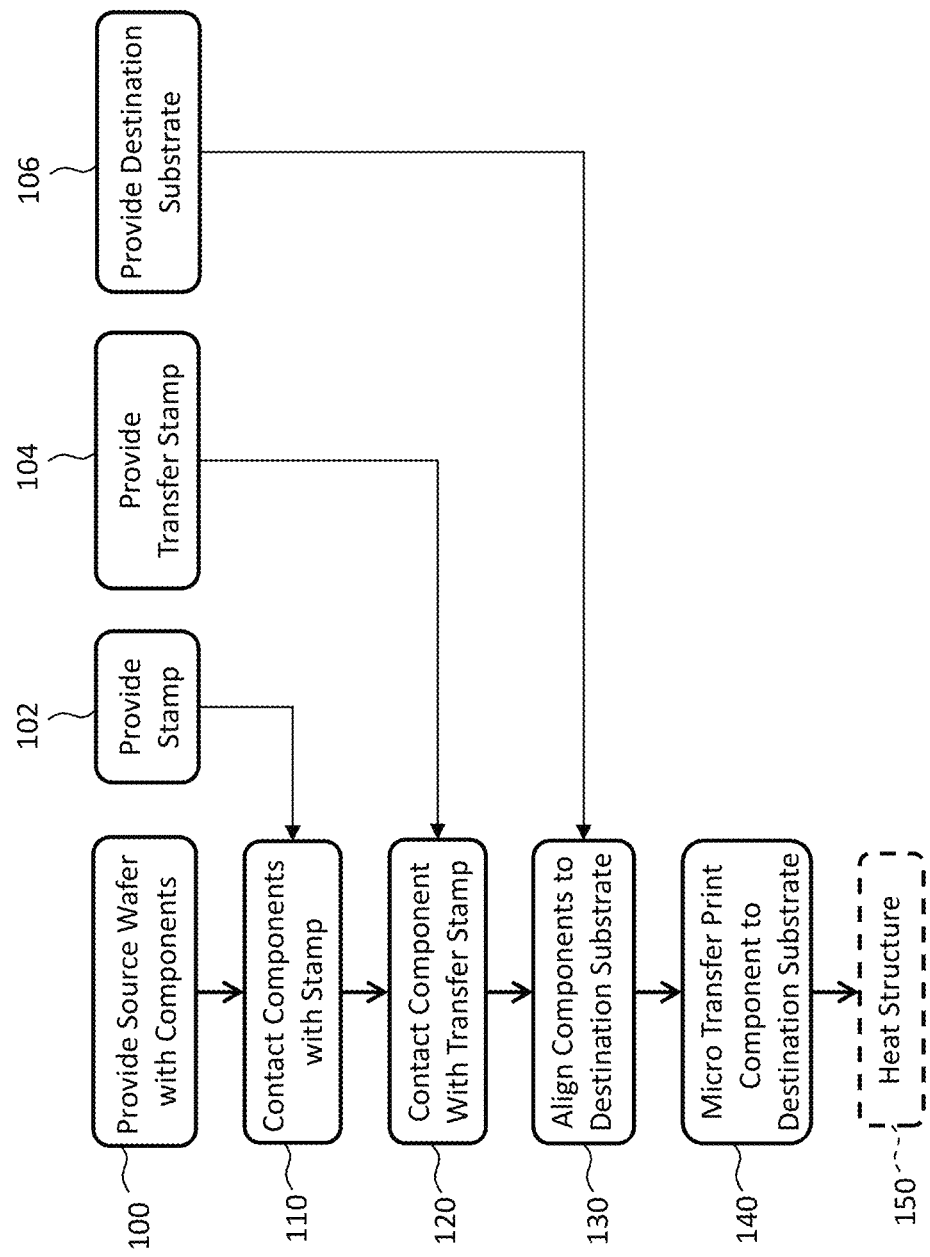
FIGS. 10-12 are flow charts illustrating methods of the present invention.

Referring next to FIG. 10, in a method of the present invention, a source wafer is provided with components 10 in step 100, a stamp is provided in step 102, a transfer stamp 30 is provided in step 104, and a destination substrate is provided in step 106. In an embodiment, the components 10 on the native source wafer are disposed in an array that corresponds to pillars 32 of the stamp. In another embodiment, a subset of the components 10 spatially correspond to the pillars 32.

The pillars 32 of the stamp are pressed against corresponding components 10 into the release layer to adhere the components 10 to the pillars 32 to transfer the pressed components 10 from the source wafer to the stamp pillars 32 in step 110. By pressing the stamp against the components 10, the tethers are broken and the components 10 are adhered to the pillars 32, for example by van der Waal's forces. The stamp is removed from the source wafer, leaving the components 10 adhered to the pillars 32. In some embodiments of the present invention, the pillars 32 have a planar dimension, for example a width, smaller than the distance D2 between the connection posts 10 on the components 10. Thus, the pillars 32 of the stamp fit between the connection posts 16 to make intimate contact with the surface of the components 10 to enhance the adhesive effect of the van der Waal's forces and improve adhesion between the components 10 and the pillars 32. If the pillars 32 were located over the connection posts 16, the connection posts 16 would form a standoff between the process side 40 of the components 10 and the pillars 32, greatly decreasing the attractive force of the van der Waal's force between the components 10 and the pillars 32.

Referring again to step 104 of FIG. 10, a transfer stamp 30 having pillars 32 is provided. In some embodiments of the present invention, the pillars 32 of the transfer stamp 30 are made of the same material as the pillars 32 of the stamp. In other embodiments of the present invention, the pillars 32 of the transfer stamp 30 are made of a different material than the pillars 32 of the stamp. In some embodiments of the present invention, the pillars 32 of the transfer stamp 30 form vacuum collets. If the pillars 32 of the stamp and transfer stamp 30 are made of the same material, the pillars 32 of the transfer stamp 30 can have a larger surface area than the pillars 32 of the stamp.

In step 120, the components 10 adhered to the pillars 32 of the stamp are brought into contact with the pillars 32 of the transfer stamp 30. Because the area of the pillars 32 of the transfer stamp 30 is larger than the area of the pillars 32 of the stamp, the van der Waal's forces between the components 10 and the pillars 32 of the transfer stamp 30 is greater than the van der Waal's forces between the components 10 and the pillars 32 of the stamp. Therefore, the components 10 will transfer to the pillars 32 of the transfer stamp 30 when the stamp is removed leaving the components 10 adhered to the pillars 32 of the transfer stamp 30. If the pillars 32 of the stamp and transfer stamp 30 are made of different material, the pillars 32 of the transfer stamp 30 should have a surface area sufficient to transfer the components 10 to the pillars 32 of the transfer stamp 30 from the pillars 32 of the stamp. If the pillars 32 of the transfer stamp 30 form a vacuum collet, the vacuum collet must be small enough to contact single components 10 and the vacuum must be strong enough to remove the contacted single component 10 from the pillars 32 of the stamp and transfer it to the pillars 32 of the transfer stamp 30.

The stamp can have more pillars 32 than the transfer stamp 30 has. Thus, not all of the components 10 on the pillars 32 of the stamp will transfer to the pillars 32 of the transfer stamp 30. The transfer stamp 30 can be laterally translated with respect to the stamp to sequentially transfer subsets of the components 10 from the pillars 32 of the stamp to the pillars 32 of the transfer stamp 30. Since the pillars 32 of the stamp are spatially aligned to the components 10 on the source wafer, to enable a sparser distribution of components 10 on the transfer stamp 30, the transfer stamp 30 can have fewer pillars 32 than the stamp so as to spatially distribute the components 10 farther apart.

The transfer stamp 30 can include pillars 32 that form vacuum collets. By applying a vacuum (or partial vacuum) to the vacuum collets, the components 10 can be transferred to the transfer stamp 30. The transfer stamp 30 is aligned with the stamp, vacuum is applied to the vacuum collets, and the transfer stamp 30 is removed from the stamp, leaving the components 10 adhered to the pillars 32 of the transfer stamp 30.

The spatial distribution of the components 10 is a matter of design choice for the end product desired. In one embodiment of the present invention, all of the components 10 in a source wafer array are transferred to the stamp. In another embodiment, a subset of the components 10 in the source wafer array is transferred. Similarly, in some embodiments of the present invention, all of the components 10 on the pillars 32 of the stamp array are transferred to the pillars 32 of the transfer stamp 30. In another embodiment, a subset of the components 10 on the pillars 32 of the stamp are transferred to the pillars 32 of the transfer stamp 30. By varying the number and arrangement of pillars 32 on the stamp and transfer stamps 30, the distribution of components 10 on the pillars 32 of the transfer stamp 30 can be likewise varied, as can the distribution of the components 10 on the destination substrate 20.

In a further embodiment of the present invention, referring to step 106 of FIG. 10, a destination substrate 20 is provided. An optional adhesive layer can be coated over the destination substrate 20. In step 130, the components 10 on the pillars 32 of the transfer stamp 30 are brought into alignment with the backplane contact pads 22 of the destination substrate 20 and pressed onto or into the backplane contact pads 22 in step 140 by micro-transfer printing with sufficient mechanical pressure against the backplane contact pads 22 to drive the connection posts 26 into or through a surface of the backplane contact pads 22 to form a robust electrical contact between the connection posts 16 of the component 10 and the backplane contact pads 22. A sufficient mechanical pressure can be an amount of force needed to cause the backplane contact pad 22 or connection post 16 to plastically deform as the connection post 16 is pressed into the backplane contact pad 22. Thus, in this embodiment, the connection posts 16 on the active components 10 may have sharp points and/or a high elastic modulus, for example, by incorporating tungsten. A connection post 16 can have a sharp point, for example, if the top of the post has an area less than 10 microns square, less than 5 microns square, or less than one-micron square. The backplane contact pads 22 can also provide adhesion to help adhere the components 10 to the destination substrate 20.

The adhesion between the components 10 and the receiving side of the destination substrate 20 should be greater than the adhesion between the components 10 and the pillars 32 of the transfer stamp 30. As such, when the transfer stamp 30 is removed from the receiving side of the destination substrate 20, the components 10 adhere more strongly to the destination substrate 20 than to the transfer stamp 30, thereby transferring the components 10 from the transfer stamp 30 to the receiving side of the destination substrate 20.

The transfer stamp 30 is then removed leaving the components 10 adhered to the destination substrate 20. An optional heat treatment in step 150 can solder or weld the connection posts 16 of the components 10 to the backplane contact pads 22 of the destination substrate 20. Thus, in a further method of the present invention, the backplane contact pads 22 (or connection posts 16) are heated, causing the backplane contact pad metal to reflow and improve adhesion between the components 10 and the destination substrate 20 and improve the electrical connection to the connection posts 16.

Figure 11:
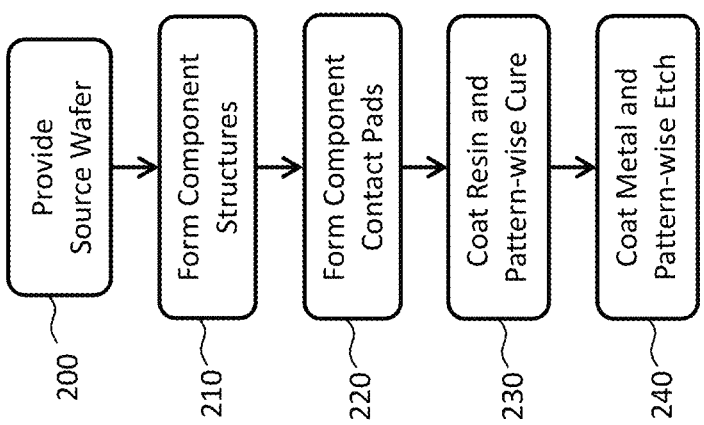
Figure 13:
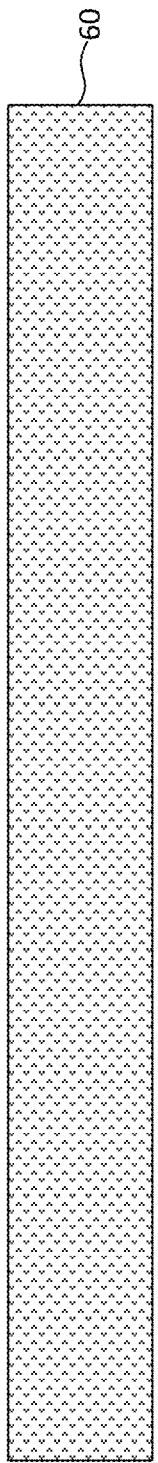
Figure 14:
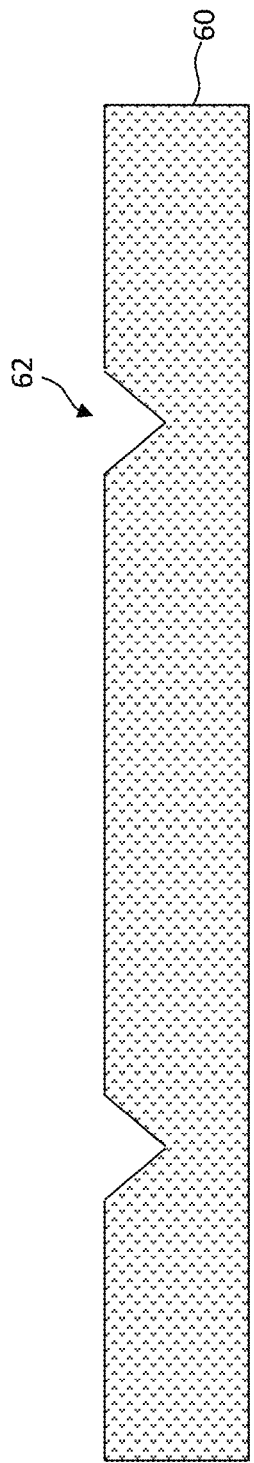

Thus, referring next to FIG. 11, methods of the present invention include selectively transferring components 10 from a native source wafer to a non-native destination substrate 20 by providing a source substrate in step 200 having a process side 40 and a plurality of components 10 formed on or in the process side 40 of the source wafer in step 210. Component contact pads 12 are formed on the process side 40 of the component 10 in step 220. Repeated steps of coating resin or metal followed by pattern-wise curing or etching form connection posts 16 in step 230. If a conductive material 19 is desired to form a multi-layer connection post 16, a metal coating can be formed by evaporation or sputtering and patterned over the patterned layers of metal or resin in step 240.

A stamp having a plurality of pillars 32 formed thereon is spatially aligned to the components 10. Each pillar 32 of the stamp has a first area. The pillars 32 of the stamp are pressed against corresponding components 10 to adhere the components 10 to the pillars 32 of the stamp. A transfer stamp 30 having a plurality of pillars 32 is spatially aligned to the pillars 32 of the stamp. Each pillar 32 of the transfer stamp 30 has a second area greater than the first area. The pillars 32 of the transfer stamp 30 are pressed against corresponding components 10 on the pillars 32 of the stamp to adhere the components 10 to the pillars 32 of the transfer stamp 30. The components 10 are aligned with and then pressed against the destination substrate 20 to adhere the components 10 to the destination substrate 20.

Figure 12:
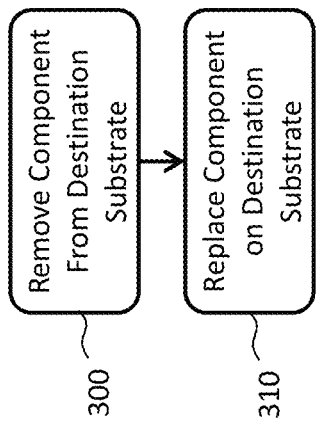

In an additional embodiment of the present invention, referring to FIG. 12, a component 10 is removed from the destination substrate 20, for example if the component 10 is faulty, in step 300. In a further optional step 310, the faulty component 10 is replaced with a different component 10, for example using the same micro transfer printing methods described above.

In yet another embodiment of the present invention, an electronically active substrate includes a destination substrate 20 having a plurality of backplane contact pads 22. The backplane contact pads 22 have a surface. A plurality of components 10 are distributed over the destination substrate 20. Each component 10 includes a component substrate, for example a semiconductor substrate, different from the destination substrate 20, for example a printed circuit board resin or epoxy substrate. Each component 10 has a circuit 14 and connection posts 16 formed on a process side 40 of the component substrate. The connection posts 16 have a base width and a height that is greater than the base width. The connection posts 16 are in electrical contact with the circuit 14 and the backplane contact pads 22. The connection posts 16 are in contact with, embedded in, or driven through the surface of the backplane contact pads 22 into the backplane contact pads 22 to electrically connect the connection posts 16 to the backplane contact pads 22.

In another embodiment, an adhesive layer 18 is formed over the destination substrate 20 between the active components 10 and the destination substrate 20 (see also FIG. 22 described below), so that the connection posts 16 pass through the adhesive layer 18 into the backplane contact pads 22. The adhesive layer 18 can be a curable adhesive layer and the adhesive layer can be cured to adhere the active components 10 to the destination substrate 20.

Figure 15:
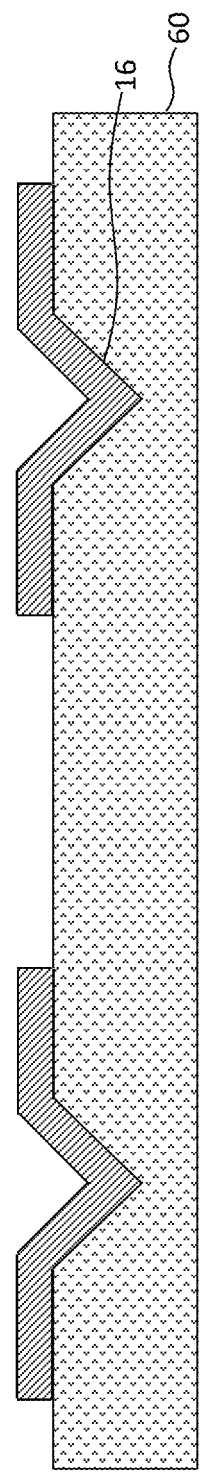

Referring next to FIGS. 13-20, in a method of the present invention, a forming substrate 60 is provided (FIG. 13) and patterned to make forms 62, for example holes or other indentations on the forming substrate 60 (FIG. 14) made by pattern-wise etching the forming substrate 60. The forming substrate 60 can be, for example, a silicon 100 wafer and can be etched by a combination of dielectric hard masks, photolithography, mask etching, and anisotropic silicon we etching with, for example KOH or TMAH, or dry etching. A layer of conductive material is deposited, for example with evaporation, e-beam deposition, sputtering, or CVD, and patterned by etching through a patterned photo-resist mask, to form connection posts 16 at least in the forms 62 and optionally also on the planar surface of the forming substrate 60 (FIG. 15). Soft metals can be used, such as gold, silver, tin, solders, or hard materials such as Ti, W, Mo, Ta, Al, or Cu.

Figure 18:
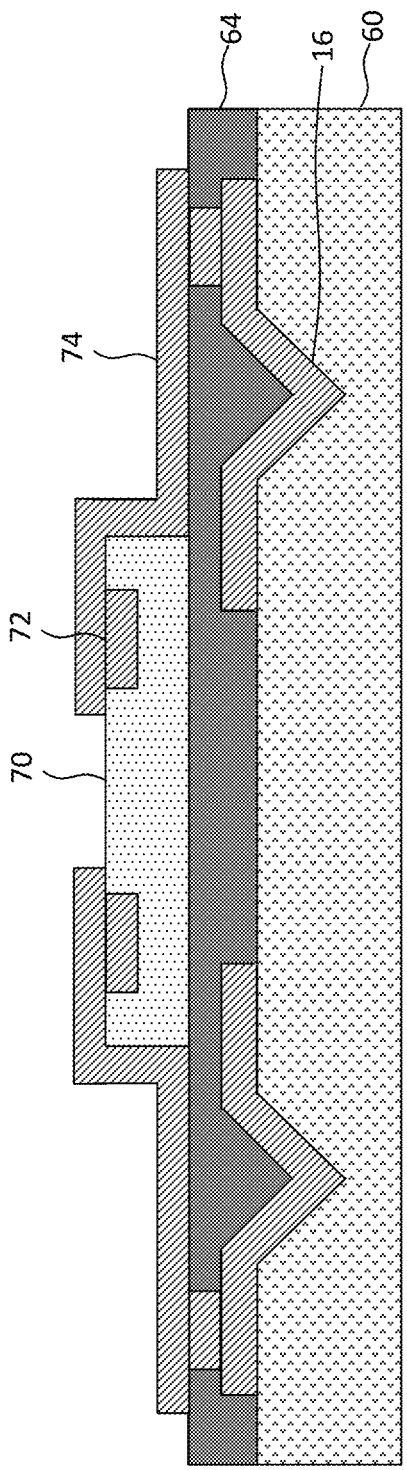
Figure 23:
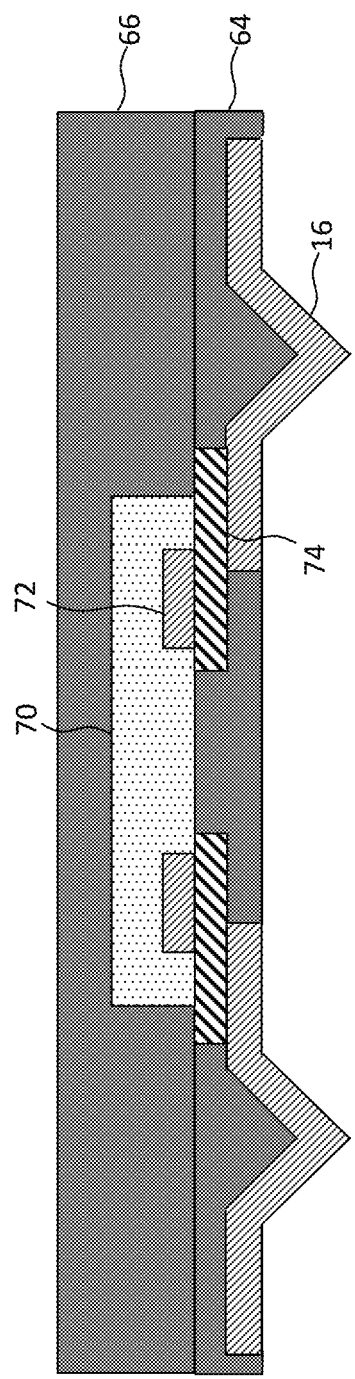
FIG. 23 is a cross section illustrating an alternative printable component structure according to an embodiment of the present invention.

A material layer, for example an insulating layer such as a first dielectric layer 64, for example an inorganic dielectric such as silicon dioxide or silicon nitride, or an organic insulator such as a polymer or a curable polymer, resin or epoxy is coated over the patterned layer of conductive material (including the connection posts 16) and the forming substrate 62 (FIG. 16). One or more chiplets 70 having chiplet contact pads 72 for electrical connections to circuitry in the chiplets 70 are disposed on the first dielectric layer 70 (FIG. 17). The chiplets 70 can be disposed with the chiplet contact pads 72 on a side of the chiplet 70 opposite the connection posts 16 (as shown in FIG. 17) or adjacent to the connection posts (FIG. 23). Next, as shown in FIG. 18, a conductor is formed that electrically connects the chiplet contact pads 72 to the connection posts 16. This can be accomplished, for example, by forming vias in the first dielectric layer and patterning a metal layer (for example evaporated or sputtered) on the first dielectric layer 64. Note that additional insulators (e.g., a patterned dielectric layer) can be provided on the chiplet 70 or the first dielectric layer 64 to avoid electrical shorts between the semiconductor layers of the chiplet 70 and the conductor 74. As shown in FIG. 18, the conductor 74 extends over the chiplet 70. Alternatively, as shown in FIG. 23, the conductor 74 is located beneath the chiplet 70. Useful materials include solder, tin, aluminum, gold, silver and other metals or metal alloys. In the embodiment of FIG. 23, additional heat treatments can be provided to electrically connect the chiplet contact pads 72 to the connection posts 16. The conductor 74 can be made to extend slightly above the surface of the first dielectric layer 64 to enhance contact between the chiplet contact pads 72 and the connection posts 16.

Figure 19:
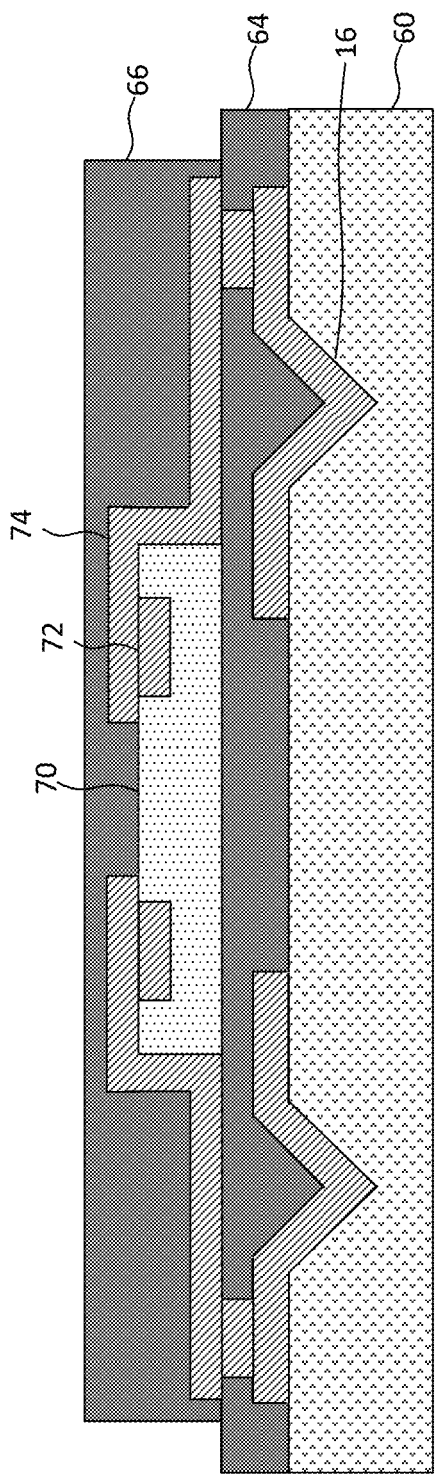
Figure 20:
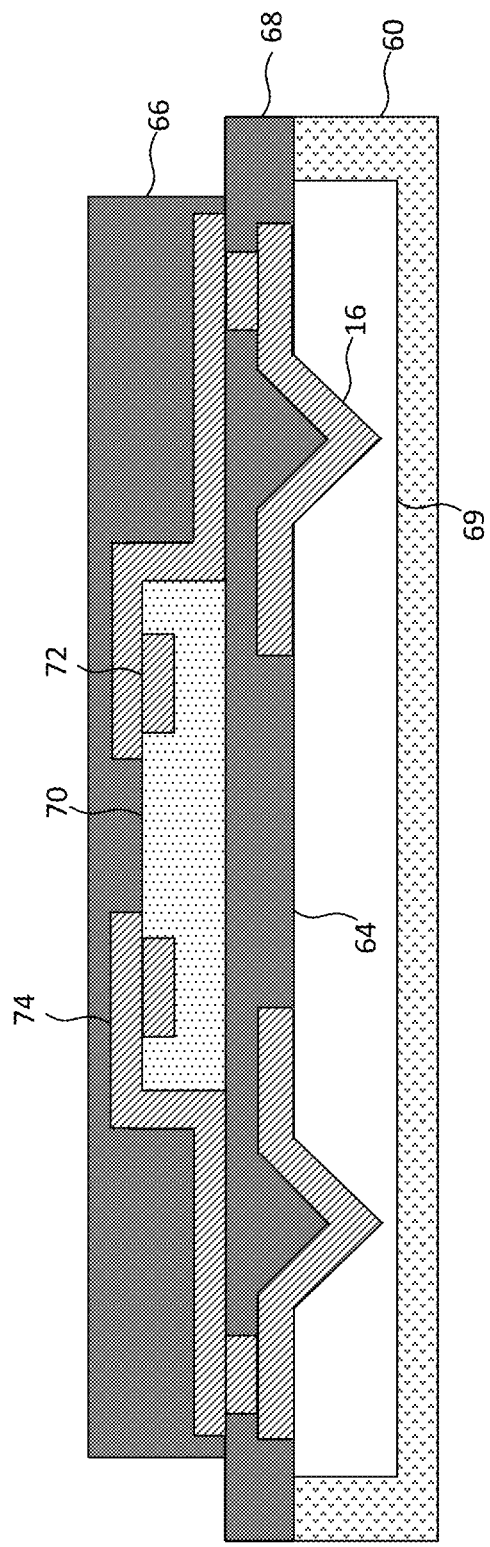

The printable component is then defined, for example by etching the first dielectric layer 64 (for example using an anisotropic etch, an aqueous base etchant, KOH, or TMAH) to form a release layer and anchors in the forming substrate 60 connected by tethers to the printable component. In one embodiment, second or third dielectric layers are provided to facilitate the definition of the printable component, the anchors, and the tethers. Referring to FIG. 19, a second dielectric layer 66 is coated and patterned to aid in defining the printable component and forming the anchors 68 and tethers. In particular, as shown in FIG. 20, a space 69 is formed (only seen in cross section) that enables the release of the printable component from the forming substrate 60.

Figure 21:
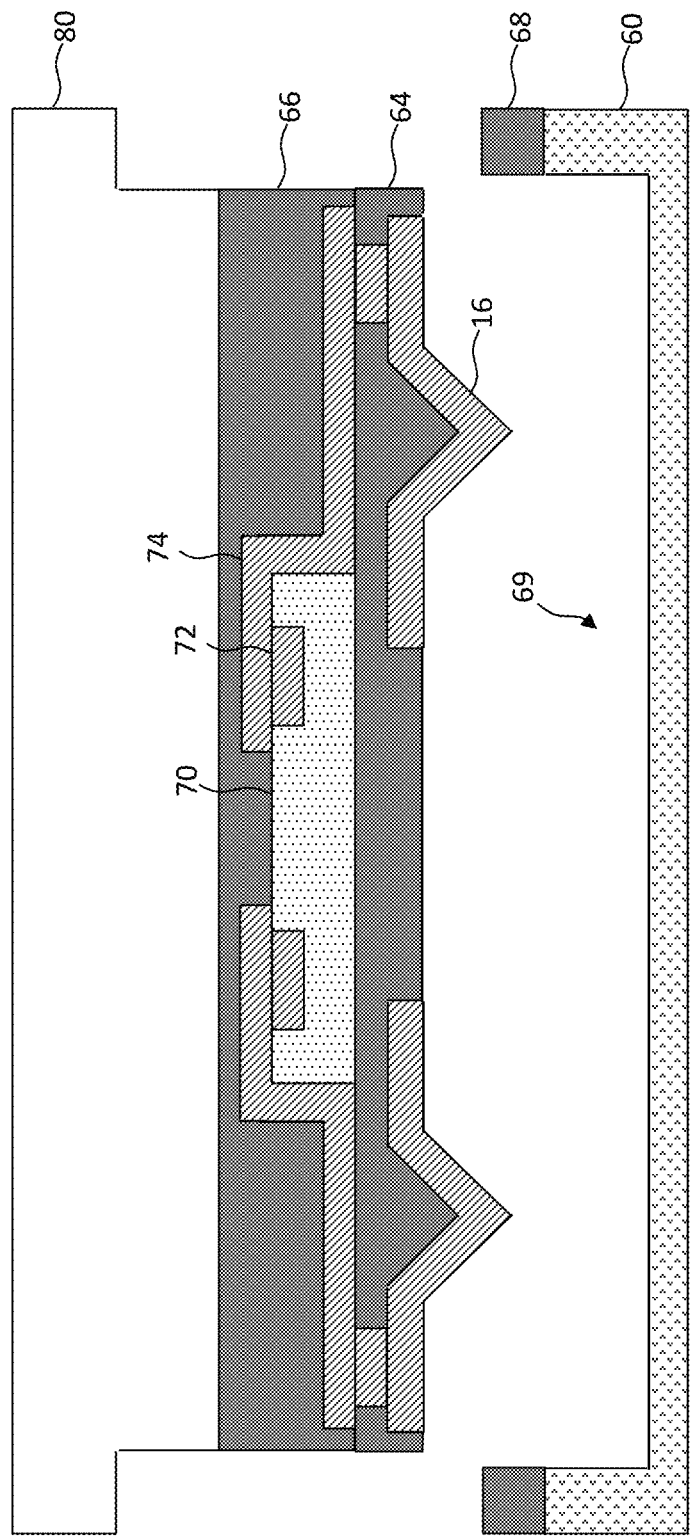
FIGS. 21-22 are cross sections illustrating steps of making a printed structure according to a method of the present invention.

In a further embodiment of the present invention, a stamp 80 is used to release the printable component from the forming substrate 60 as part of a micro transfer print process, as shown in FIG. 21. The printable component is then micro transfer printed to a destination substrate 20 as described above (FIG. 22) so that each connection post 16 is in contact with, extends into, or extends through a backplane contact pad 22 of the destination substrate 20 to electrically connect the backplane contact pads 22 to the connection posts 16 and the chiplet contact pads 72. The backplane contact pads can include a soft metal, for example silver, tin, gold, or solder, or a harder metal. FIG. 22 illustrates the backplane contact pads 22 covered with a polymer layer, for example an adhesive layer or other polymer layer that facilities embedding the connection posts 16 in the backplane contact pads 22. Alternatively, as described above but not shown, a compliant material layer, for example a polymer, is located beneath the backplane contact pads 22.

FIG. 23 illustrates an alternative orientation of the chiplet 70 to the connection posts 16 corresponding to FIG. 19 (but without illustrating the forming substrate 60). The structure of FIG. 23 can be processed to define the printable component, tethers, and anchors 64 and printed as described above with respect to FIGS. 20-22. Thus, according to embodiments of the present invention, a printable component includes a first dielectric layer 64 having connection posts 16 protruding from the dielectric layer 64, a chiplet 70 having chiplet contact pads 72 disposed on the first dielectric layer 64, and conductors 74 electrically connecting the connection posts 16 to the chiplet contact pads 72. The chiplet contact pads 72 can be located on a side of the chiplet 70 adjacent to the connection posts 16 (FIG. 23) or on a side of the chiplet 70 opposite the connection posts 16 (FIG. 19). A patterned electrical connection layer can form the conductor 74 over the chiplet 70 and first dielectric layer 64 (FIG. 19) or between the connection posts 16 and the chiplet contact pads 72 (FIG. 23). In an embodiment, the connection posts 16 are multi-layer connection posts 16.

In a further embodiment of the present invention, the component is a light-emitting component that emits light. In one arrangement, the light is emitted in a direction opposite to the connection posts 16. In a further embodiment, the chiplet 70 is covered with a second dielectric layer (e.g., second dielectric layer 66). The second dielectric layer 66 can be transparent to visible light or to the frequencies of light emitted by the light emitter and the light can be emitted through the second dielectric layer 66.

Figure 24:
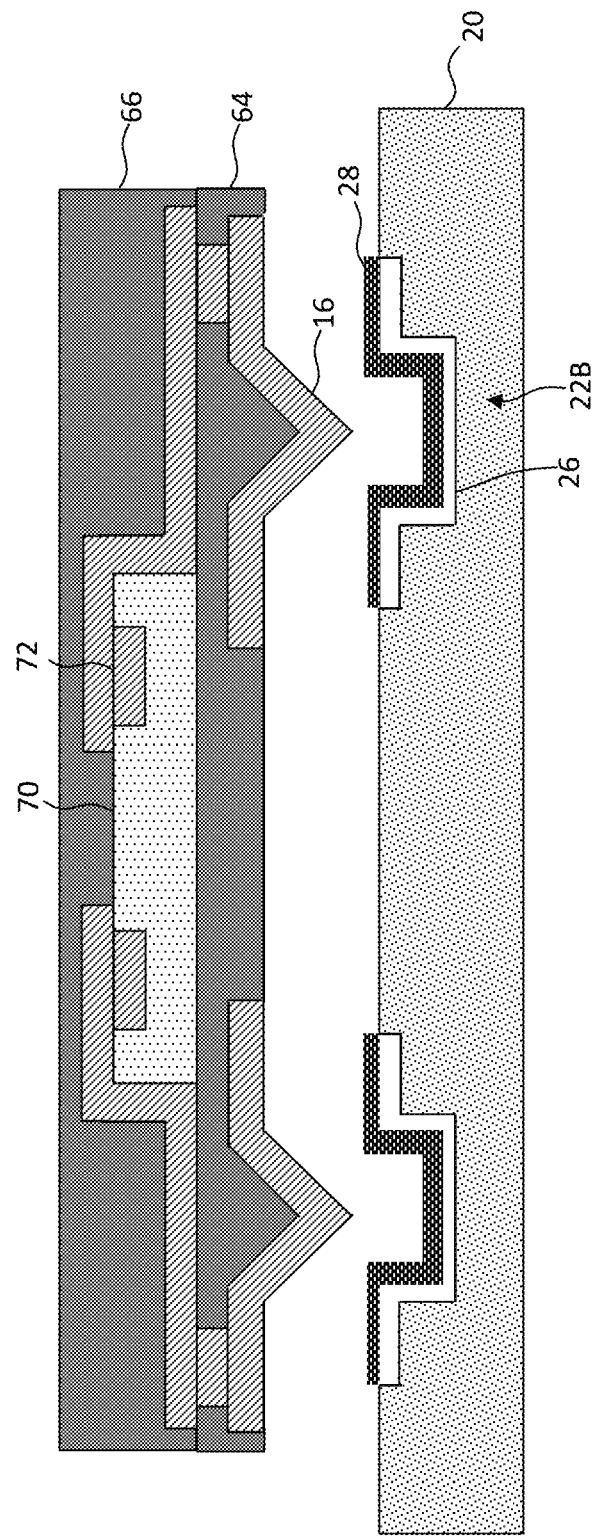
FIG. 24 is a cross section illustrating an alternative printed structure according to an embodiment of the present invention.

Referring next to FIG. 24, in an embodiment, a destination substrate 20 for receiving transfer-printed printable components includes a substrate having a surface on or in which a plurality of non-planar contact pads 22B are formed and exposed on the surface so that electrical connections can be made to the non-planar contact pads 22B. The non-planar contact pads 22B can be a multi-layer contact pads having one layer 28 on another, layer 26 as described. In this embodiment, the backplane contact pad 22 can have a first conductive layer and a second conductive layer over the first conductive layer, and the second conductive layer has a lower melting temperature than the first conductive layer. The second conductive layer can be a solder. Alternatively, the backplane contact pad 22 is coated with a non-conductive layer or the backplane contact pad 22 is formed on a compliant non-conductive layer, to facilitate electrical connection and adhesion. The non-conductive layer can be a polymer or an adhesive or the compliant non-conductive layer can be a polymer.

Figure 25:
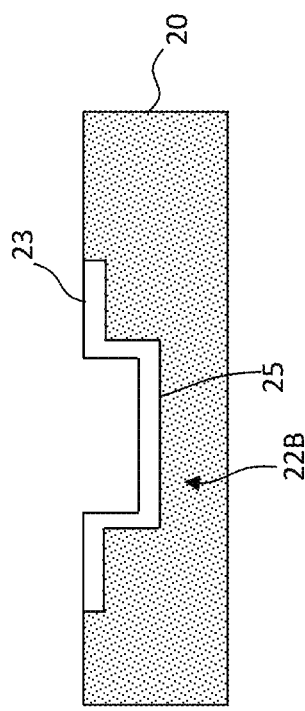
FIGS. 25 and 26 are cross sections illustrating alternative contact pads on a destination substrate according to an embodiment of the present invention.
Figure 26:
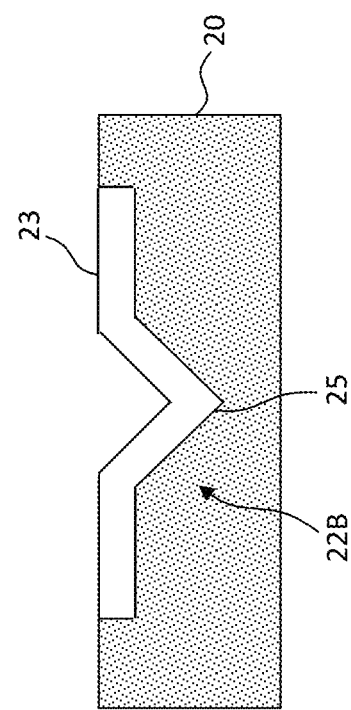

Referring also to FIGS. 25 and 26, the non-planar contact pads 22B have a perimeter portion 23 surrounding a central portion 25. The perimeter portion 23 is closer to the surface than the central portion 25, so that the non-planar contact pads are shaped to accept the connection posts 16 of the printable components and improve the electrical connection between the connection posts 16 and the non-planar contact pads 22B, for example by increasing the surface area of connection posts 16 and the non-planar contact pads 22B that are in contact.

Figure 27:
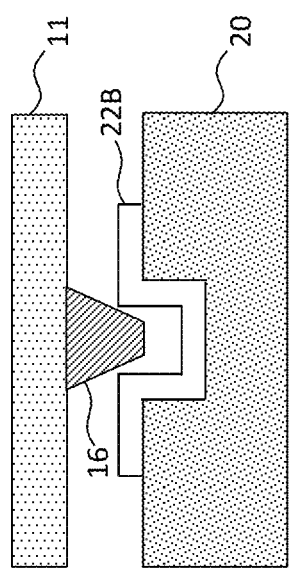
FIGS. 27 and 28 are cross sections illustrating alternative contact pads and a connection post according to embodiments of the present invention.
Figure 28:
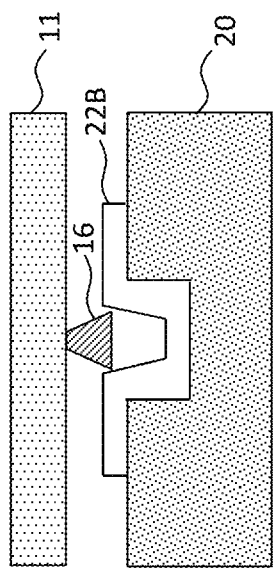

As shown in FIGS. 27 and 28, in further embodiments of the present invention, a variety of connection posts 60 having different shapes are inserted into the non-planar backplane contact pads 22B.

Figure 29:
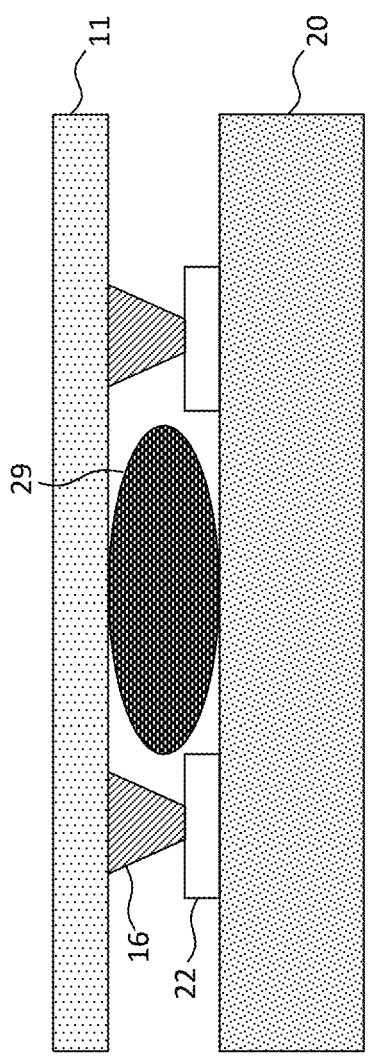
FIG. 29 is a cross section illustrating an underfilled volume between the destination substrate and the printable component according to an embodiment of the present invention.

As shown in FIG. 29, a shrinkable material 29 is disposed in and underfills the volume between the printable component and the destination substrate 20. The shrinkable material can be an adhesive and can adhere the printable component and the destination substrate 20. By underfill is meant that the shrinkable material 29 does not fill the volume between the printable component and the destination substrate 20. Furthermore, with a heat treatment provided after disposing the shrinkable material, the shrinkable material 29 shrinks and provides compression between the printable component and the destination substrate 20 to further strengthen and make robust the electrical connection between the connection posts and the backplane contact pads 22.

According to one embodiment of the present invention, the source wafer can be provided with components 10 and component contact pads 12 and connection posts 16 already formed on the process side 40 of the source wafer. Alternatively, an unprocessed source wafer can be provided and the components 10 formed on the process side 40 of the source wafer. An unprocessed source wafer is a substrate that does not yet include components 10. The unprocessed source wafer can have other processing steps completed, for example, cleaning, deposition of material layers, or heat or chemical treatments, as are used in the photo-lithographic arts. Components 10 are formed, for example using photo-lithographic processes including forming masks over the source wafer, etching materials, removing masks, and depositing materials. Such processes are used in the photo-lithographic arts. Using such processes, components 10 are formed on or in the process side 40 of the source wafer.

Components 10 can be small electronic integrated circuits, for example, having a size of about 5 microns to about 5000 microns in a dimension. The electronic circuits can include semiconductor materials (for example inorganic materials such as silicon or gallium arsenide, or inorganic materials) having various structures, including crystalline, microcrystalline, polycrystalline, or amorphous structures. In another embodiment, the components 10 are passive, for example including a conductor that, when used in a printed structure 50 serves to electrically connect one conductor (e.g., a backplane contact pad 22) to another, forming a jumper. The components 10 can also include insulating layers and structures such as silicon dioxide, nitride, and passivation layers and conductive layers or structures including wires 13 made of aluminum, titanium, silver, or gold that foam an electronic circuit. Connection posts 16 or component contact pads 12 can be formed of metals such as aluminum or polysilicon semiconductors and can be located on the process side 40 of the components 10. Methods and materials for making component 10 electronic circuits are used in the integrated circuit arts. Large numbers of such small integrated circuits are formed on a single source wafer. The components 10 are typically packed as closely as possible to use the surface area of the source wafer as efficiently as possible.

In some embodiments, the components 10 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the component 10 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates 20. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the components 10 can be formed in a micro-crystalline, polycrystalline, or amorphous semiconductor layer.

The components 10 can be constructed using foundry fabrication processes used in the art. Layers of materials can be used, including materials such as metals, oxides, nitrides and other materials used in the integrated-circuit art. Each component 10 can be a complete semiconductor integrated circuit and can include, for example, transistors. The components 10 can have different sizes, for example, 1000 square microns or 10,000 square microns, 100,000 square microns, or 1 square mm, or larger, and can have variable aspect ratios, for example 1:1, 2:1, 5:1, or 10:1. The components 10 can be rectangular or can have other shapes.

Embodiments of the present invention provide advantages over other printing methods described in the prior art. By employing connection posts 16 on components 10 and a printing method that provides components 10 on a destination substrate 20 with the process side 40 and connection posts 16 adjacent to the destination substrate 20, a low-cost method for printing chiplets in large quantities over a destination substrate 20 is provided. Furthermore, additional process steps for electrically connecting the components 10 to the destination substrate 20 are obviated.

The source wafer and components 10, stamp, transfer stamp 30, and destination substrate 20 can be made separately and at different times or in different temporal orders or locations and provided in various process states.

The method of the present invention can be iteratively applied to a single or multiple destination substrates 20. By repeatedly transferring sub-arrays of components 10 from a transfer stamp 30 to a destination substrate 20 and relatively moving the transfer stamp 30 and destination substrates 20 between stamping operations by a distance equal to the spacing of the selected components 10 in the transferred sub-array between each transfer of components 10, an array of components 10 formed at a high density on a source wafer can be transferred to a destination substrate 20 at a much lower density. In practice, the source wafer is likely to be expensive, and forming components 10 with a high density on the source wafer will reduce the cost of the components 10, especially as compared to forming components on the destination substrate 20. Transferring the components 10 to a lower-density destination substrate 20 can be used, for example, if the components 10 manage elements distributed over the destination substrate 20, for example in a display, digital radiographic plate, or photovoltaic system.

In particular, in the case wherein the active component 10 is an integrated circuit formed in a crystalline semiconductor material, the integrated circuit substrate provides sufficient cohesion, strength, and flexibility that it can adhere to the destination substrate 20 without breaking as the transfer stamp 30 is removed.

In comparison to thin-film manufacturing methods, using densely populated source substrates wafers and transferring components 10 to a destination substrate 20 that requires only a sparse array of components 10 located thereon does not waste or require active layer material on a destination substrate 20. The present invention can also be used in transferring components 10 made with crystalline semiconductor materials that have higher performance than thin-film active components. Furthermore, the flatness, smoothness, chemical stability, and heat stability requirements for a destination substrate 20 used in embodiments of the present invention may be reduced because the adhesion and transfer process is not substantially limited by the material properties of the destination substrate 20. Manufacturing and material costs may be reduced because of high utilization rates of more expensive materials (e.g., the source substrate) and reduced material and processing requirements for the destination substrate 20.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D1 distance
D2 distance
H height
W base width
W2 peak width
10, 10A, 10B, 10C, 10D component
11 semiconductor layer
12 component contact pad
13 wire
14 circuit
15 electrical connection
16 connection post
16A short connection post
16B deformed/crumpled connection post
17 group of connection posts
18 post material
19 conductive material/solder
20 destination substrate
22 backplane contact pad
22A deformed/crumpled backplane contact pad
22B non-planar contact pad
23 perimeter portion
24 conductive material/solder
25 central portion
26 layer
28 layer
29 shrinkable material
30 transfer stamp
32 pillars
40 process side
42 back side
50 printed structure
60 forming substrate
62 form
64 first dielectric layer
66 second dielectric layer
68 anchor 69 space
70 chiplet
72 chiplet contact pad
74 conductor
80 stamp
100 provide source wafer step
102 provide stamp step
104 provide transfer stamp step
106 provide destination substrate step
110 contact components with stamp step
120 contact components with transfer stamp step
130 align components to destination substrate step
140 micro transfer print components to destination substrate step
150 optional heat structure step
200 provide source wafer step
210 form component structure in wafer step
220 form component contact pads on component structure step
230 coat resin and pattern-wise cure step
240 coat metal and pattern-wise etch step
300 remove component from destination substrate step
310 replace component on destination substrate step

The invention claimed is:

1. A micro-transfer-printable component structure, comprising:
   a chiplet comprising a semiconductor substrate and one or more chiplet contact pads;
   a dielectric layer comprising dielectric material, wherein the chiplet is on a first side of the dielectric layer;
   a plurality of electrical connections electrically connected to the one or more chiplet contact pads, wherein
      (i) each of the electrical connections comprises an electrically conductive connection post protruding from the dielectric layer on a second side of the dielectric layer opposite the first side,
      (ii) the connection post is a multi-layer connection post comprising a portion of the dielectric material that is coated with a conductive material,
      (iii) the connection post has a sharp point, and
      (iv) the connection post has a base adjacent to the dielectric layer and a peak forming the sharp point; and
   a tether connected to the dielectric layer,
   wherein the dielectric layer has a thickness less than or equal to 25 microns and the micro-transfer-printable component structure has a width and a length each less than or equal to 200 microns and a thickness of from 2 µm to 50 µm.

2. The component structure of claim 1, wherein the plurality of electrical connections comprises two or more connection posts that are directly electrically connected to each other.

3. The component structure of claim 2, wherein the two or more connection posts comprise a first connection post and a second connection post having a different height from the first connection post.

4. The component structure of claim 2, wherein the connection posts are disposed in groups and a spacing between adjacent connection posts within a given group is less than a spacing between adjacent groups.

5. The component structure of claim 4, wherein connection posts within the given group are electrically shorted together.

6. The component structure of claim 1, wherein the chiplet comprises a light-emitting diode, photo-diode, or transistor.

7. The component structure of claim 1, wherein the connection posts have substantially planar sides or are substantially pyramidal.

8. The component structure of claim 1, wherein the chiplet is an active component comprising an active element or a passive component comprising a passive element.

9. The component structure of claim 1, wherein the chiplet has at least one of a width and a length, from 2 to 5 µm, 5 to 10 µm, 10 to 20 µm, or 20 to 50 µm.

10. The component structure of claim 1, wherein the chiplet contact pads are on a common side of the chiplet opposite the dielectric layer and wherein a portion of the chiplet contact pads are connected to the electrically conductive connection post exclusively with a patterned electrical conductor layer.

11. The component structure of claim 1, wherein the chiplet contact pads are on a common side of the chiplet adjacent to the dielectric layer.

12. The component structure of claim 1, wherein the peak is centered over the base.

13. The component structure of claim 1, wherein the chiplet is a compound structure comprising active elements, passive elements, or a combination of one or more active elements and one or more passive elements.

14. The component structure of claim 1, wherein at least a portion of the second side is exposed.

15. The component structure of claim 1, wherein the dielectric layer has a thickness less than or equal to 15 microns and the micro-transfer-printable component structure and a thickness of from 2 µm to 20 µm.

* * * * *